(12) United States Patent
Cho et al.

(10) Patent No.: US 7,432,160 B2
(45) Date of Patent: Oct. 7, 2008

(54) SEMICONDUCTOR DEVICES INCLUDING TRANSISTORS HAVING THREE DIMENSIONAL CHANNELS AND METHODS OF FABRICATING THE SAME

(75) Inventors: Eun-Suk Cho, Gyeonggi-do (KR); Chul Lee, Seoul (KR)

(73) Assignee: Samsung Electronics Co., Ltd. (KR)

(*) Notice: Subject to any disclaimer, the term of this patent is extended or adjusted under 35 U.S.C. 154(b) by 67 days.

(21) Appl. No.: 11/699,301

(22) Filed: Jan. 29, 2007

(65) Prior Publication Data

US 2007/0184627 A1    Aug. 9, 2007

(30) Foreign Application Priority Data

Feb. 9, 2006    (KR) ..................... 10-2006-0012708

(51) Int. Cl.
*H01L 21/336* (2006.01)
*H01L 21/8234* (2006.01)
(52) U.S. Cl. ..................... 438/268; 438/197; 438/275; 438/289; 257/E21.629; 257/E21.633
(58) Field of Classification Search .......... 257/E21.629, 257/E21.633
See application file for complete search history.

(56) References Cited

U.S. PATENT DOCUMENTS

2005/0032322 A1    2/2005    Kim et al.
2005/0179030 A1    8/2005    Seo et al.
2007/0134884 A1*   6/2007    Kim et al. ................... 438/424

FOREIGN PATENT DOCUMENTS

KR    10-2004-0075566 A    8/2004
KR    10-2005-0015975 A    2/2005
KR    10-2005-0081389 A    8/2005

* cited by examiner

*Primary Examiner*—Scott B. Geyer
*Assistant Examiner*—Mohsen Ahmadi
(74) *Attorney, Agent, or Firm*—Myers Bigel Sibley & Sajovec

(57) ABSTRACT

Semiconductor devices including a gate electrode crossing over a semiconductor fin on a semiconductor substrate are provided. A gate insulating layer is provided between the gate electrode and the semiconductor fin. A channel region having a three-dimensional structure defined at the semiconductor fin under the gate electrode is also provided. Doped region is provided in the semiconductor fin at either side of the gate electrode and an interlayer insulating layer is provided on a surface of the semiconductor substrate. A connector region is coupled to the doped region and provided in an opening, which penetrates the interlayer insulating layer. A recess region is provided in the doped region and is coupled to the connector region. The connector region contacts an inner surface of the recess region. Related methods of fabricating semiconductor devices are also provided herein.

12 Claims, 25 Drawing Sheets

SEMICONDUCTOR DEVICES INCLUDING TRANSISTORS HAVING THREE DIMENSIONAL CHANNELS AND METHODS OF FABRICATING THE SAME

CLAIM OF PRIORITY

This application is related to and claims priority from Korean Patent Application No. 2006-0012708, filed on Feb. 9, 2006, in the Korean Intellectual Property Office, the disclosure of which is hereby incorporated herein by reference as if set forth in its entirety.

FIELD OF THE INVENTION

The present invention generally relates to semiconductor devices and, more particularly, to semiconductor devices and related methods of fabrication.

BACKGROUND OF THE INVENTION

As semiconductor devices become more highly integrated, a channel width of a metal oxide semiconductor field effect transistor (MOSFET) may decrease such that the amount of driving current of the transistor is proportionately decreased. This decrease in driving current may lead to functional problems in the semiconductor device. For example, operation speed of the transistor may be reduced. Furthermore, a data-sensing margin of a semiconductor memory device using the different amount of driving current of the transistor, and the like may be degraded.

To address the problems discussed above, there has been proposed a fin transistor having a vertical channel, which may be capable of increasing the amount of driving current within a limited area. An example fin transistor will now be discussed with respect to FIGS. 1A through 1C.

FIG. 1A is a plan view of a conventional fin transistor and FIGS. 1B and 1C are cross-sections taken along lines A-A' and B-B' of FIG. 1, respectively. As illustrated in FIGS. 1A, 1B and 1C, a semiconductor fin 2 is provided on a semiconductor substrate 1. A device isolation pattern 3 is provided on the semiconductor substrate 1 such that it includes a lower portion of the semiconductor fin 2. A gate electrode 5 crosses over the semiconductor fin 2, wherein a gate oxide layer 4 is between the gate electrode 5 and the semiconductor fin 2. A doped region 6 is provided on the semiconductor fin 2 at either side of the gate electrode 5. The doped region 6 provides source/drain regions. The semiconductor fin 2 under the gate electrode 5 provides a channel region. The channel region has a three-dimensional structure, which protrudes perpendicularly over the semiconductor substrate 1. When a fin transistor is turned on, a plane channel is generated along an upper surface of the channel region, and vertical channels are formed along both side surfaces of the channel region.

Subsequently, an interlayer insulating layer 7 is provided on a surface of the semiconductor substrate 1, and the contact plug 9 fills an opening 8. Herein, the opening 8 is formed such that it penetrates the interlayer insulating layer 7 to expose at least a portion of the upper surface of the doped region 6. In other words, the contact plug 9 contacts the upper surface of the doped region 6.

Conventional fin transistors may have a wide channel region within a limited area provided by vertical channels formed along both side surfaces of the channel region. Accordingly, the amount of driving current of the fin transistor may be increased in comparison with that of a conventional planar transistor.

However, since the contact plug 9 contacts the upper surface of the doped region 6, resistance between a lower portion of the channel region (hereinafter referred to as a lower channel region) and the contact plug 9 may be greater than a resistance between an upper portion of the channel region (hereinafter referred to as an upper channel region) and the contact plug 9. In other words, a current path between the lower channel region and the contact plug 9 through the doped region 6 may be longer than a current path between the upper channel region and the contact plug 9 through the doped region 6. Generally, the doped region 6 has a higher resistivity than the contact plug 9. Therefore, the resistance between the lower channel region and the contact plug 9 may be greater than the resistance between the upper channel region and the contact plug 9. Accordingly, a voltage drop between the lower channel region and the contact plug 9 may be relatively large so that the amount of current flowing through the lower channel region becomes smaller than the amount of current flowing through the upper channel region. Thus, the fin transistor may not be able to secure the amount of driving current sufficiently in spite of the increased channel width.

SUMMARY OF THE INVENTION

Some embodiments of the present invention provide semiconductor devices including a gate electrode crossing over a semiconductor fin on a semiconductor substrate. A gate insulating layer is provided between the gate electrode and the semiconductor fin. A channel region having a three-dimensional structure defined at the semiconductor fin under the gate electrode is also provided. Doped region is provided in the semiconductor fin at either side of the gate electrode and an interlayer insulating layer is provided on a surface of the semiconductor substrate. A connector region is coupled to the doped region and provided in an opening, which penetrates the interlayer insulating layer. A recess region is provided in the doped region and is coupled to the connector region. The connector region contacts an inner surface of the recess region.

In further embodiments of the present invention, the recess region may include a recessed region in a central portion of an upper surface of the doped region. The inner surfaces of the recess region may be provided by the doped region and the opening may expose at least a portion of the recess region.

In still further embodiments of the present invention, the recess region may be provided in a portion of the doped region exposed by the opening. An inner surface of the recess region and an inner surface of the opening may be aligned and the connector region may be provided in the opening and the recess region.

In some embodiments of the present invention, the opening may be hole-shaped and the connector region may be pillar-shaped such that the connector region fills the opening. In certain embodiments of the present invention, the opening may have a groove-shape in other words parallel to the gate electrode and the connector region may have a line-shape such that it fills the opening.

In further embodiments of the present invention, a floating gate may be provided between the gate electrode and the gate insulating layer. A blocking insulating pattern may be provided between the floating gate and the gate electrode.

In still further embodiments of the present invention, the channel region may include a recessed channel region in a central portion of an upper surface of the channel region and the gate electrode may be provided in the channel recess region such that the gate insulating layer is between the channel recess region and the gate electrode.

Some embodiments of the present invention provide semiconductor devices including a gate electrode crossing over a semiconductor fin on a semiconductor substrate. A gate insulating layer is provided between the gate electrode and the semiconductor fin. A channel region having a three-dimensional structure defined at the semiconductor fin under the gate electrode is also provided. A doped region is provided in the semiconductor fin at either side of the gate electrode. An interlayer insulating layer is provided on a surface of the semiconductor substrate. A connector region is provided such that it fills an opening. The opening penetrates the interlayer insulating layer to expose at least a portion of an upper surface and both side surfaces of the doped region.

In further embodiments of the present invention, the opening may be hole-shaped such that it has a greater width than a width of the doped region parallel to a channel width of the channel region and the connector region may be pillar-shaped such that it fills the opening. In certain embodiments of the present invention, the opening may be groove-shaped such that it crosses over the doped region parallel to the gate electrode and the connector region may be line-shaped such that it fills the opening.

In still further embodiments of the present invention, a floating gate may be provided between the gate electrode and the gate insulating layer. A blocking insulating pattern may be provided between the floating gate and the gate electrode.

In some embodiments of the present invention, the channel region may include a channel recess region in a central portion of an upper surface of the channel region and the gate electrode may fill the channel recess region such that the gate insulating layer is between the channel recess region and the gate electrode.

Although embodiments of the present invention are primarily discussed above with respect to semiconductor devices, methods of fabricating semiconductor devices are also provided herein.

DETAILED DESCRIPTION OF EMBODIMENTS OF THE INVENTION

Figure 1A:
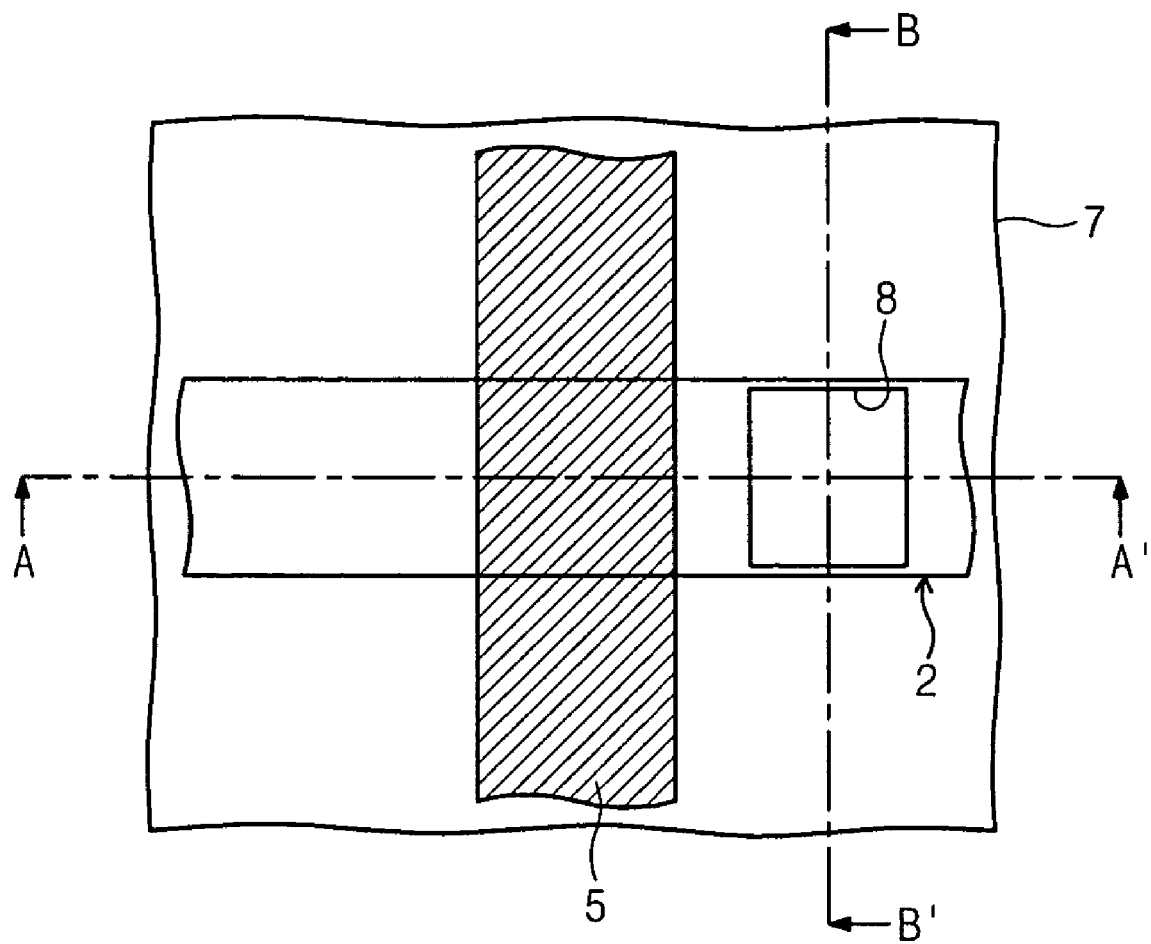
FIG. 1A is a plan view of a conventional fin transistor.
Figure 1B:
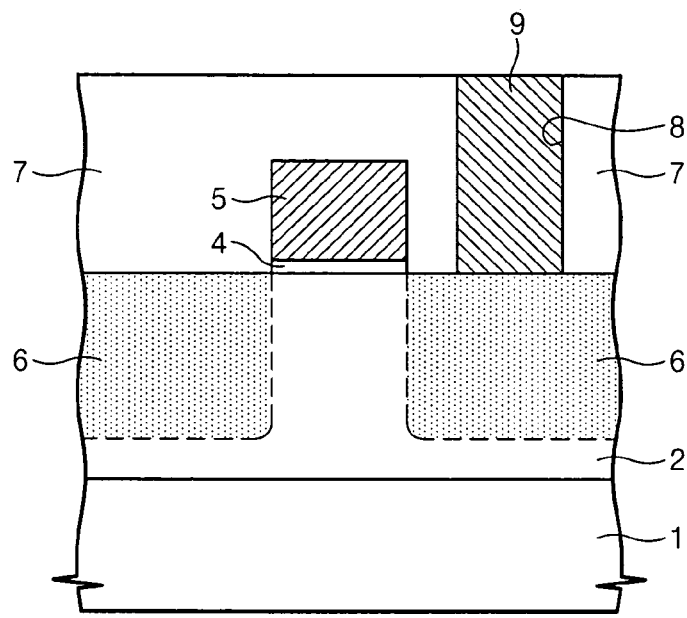
FIGS. 1B and 1C are cross-sections taken along lines A-A' and B-B' of FIG. 1A, respectively.
Figure 1C:
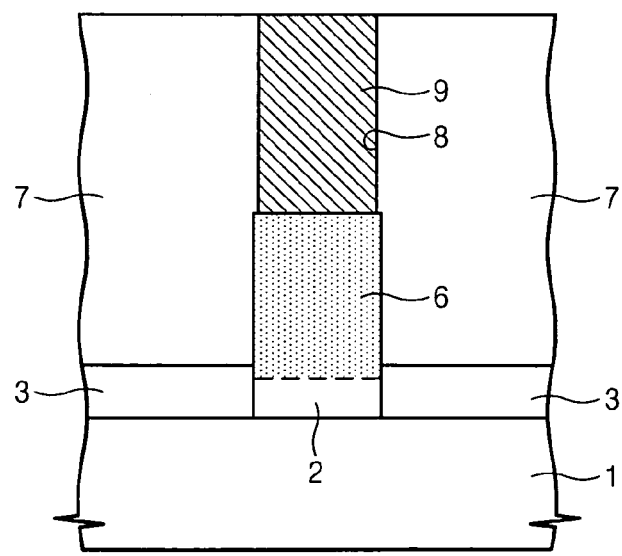

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

It will be understood that although the terms first and second are used herein to describe various elements, these elements should not be limited by these terms. These terms are only used to distinguish one element from another element.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning in other words consistent with their meaning in the context of the relevant art and this specification and will not be interpreted in an idealized or overly formal sense unless expressly so defined herein.

Figure 2:
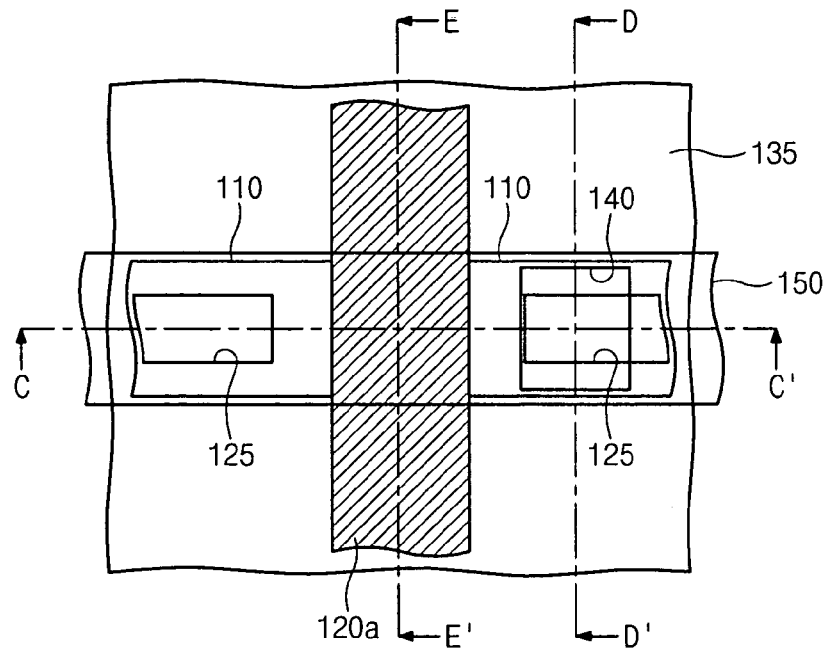
FIG. 2 is a plan view of semiconductor devices according to some embodiments of the present invention.
Figure 3A:
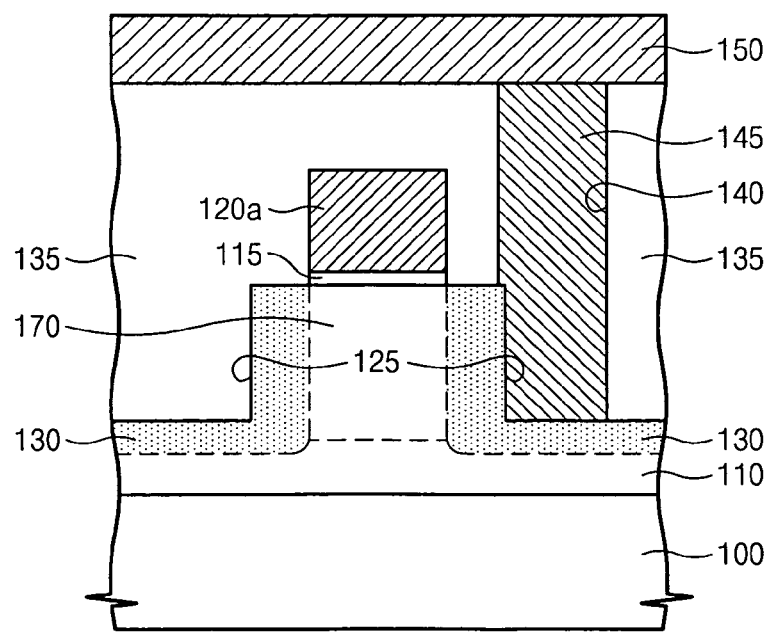
FIGS. 3A, 3B and 3C are cross-sections taken along lines C-C', D-D' and E-E' of FIG. 2, respectively.
Figure 3B:
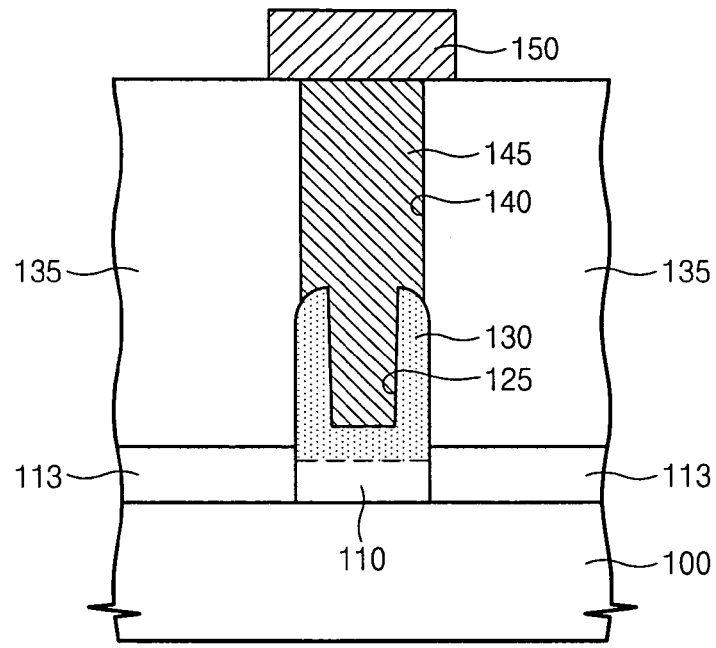
Figure 3C:
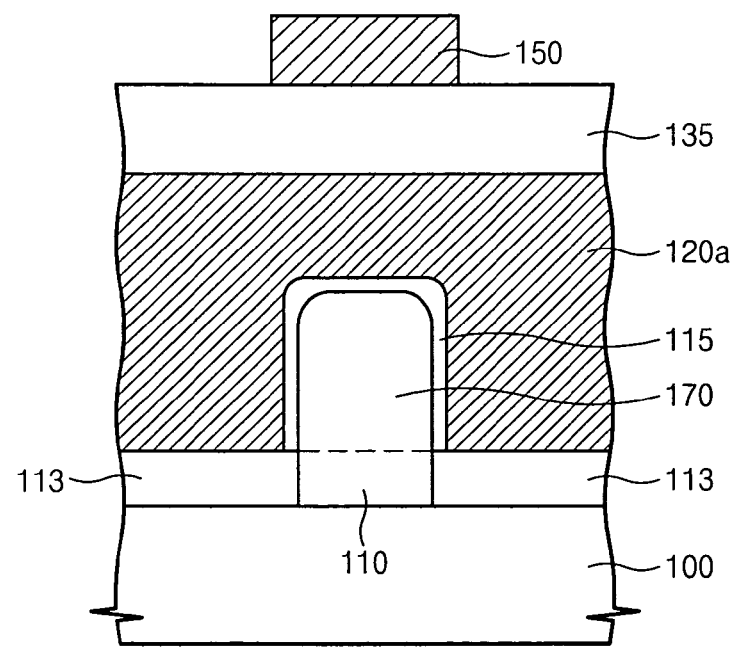

FIG. 2 a plan view of semiconductor devices according to some embodiments of the present invention. FIGS. 3A, 3B and 3C are cross-sections taken along lines C-C', D-D' and E-E' of FIG. 2, respectively. Referring first to FIGS. 2, 3A, 3B and 3C, a semiconductor fin 110 having a three-dimensional structure is provided on a semiconductor substrate 100. In some embodiments of the present invention, a upper corner of the semiconductor fin 110 is rounded. As illustrated in the Figures, a lower surface of the semiconductor fin 110 may contact the substrate 100. In some embodiments of the present invention, the semiconductor fin 110 may be provided on a buried insulating layer (not shown) provided on the substrate 100. In other words, the semiconductor fin 110 may be formed from a semiconductor layer provided on the buried insulating layer of silicon on insulator (SOI) substrate. Thereinafter, although detailed descriptions will be set forth assuming that the semiconductor fin 100 is in contact with the substrate 100, embodiments of the present invention may be provided on SOI substrates without departing from the scope of the present invention.

A device isolation pattern 113 is provided on the substrate 100 around the semiconductor fin 110. The device isolation pattern 113 may include side surfaces of a lower portion of the semiconductor fin 110. The device isolation pattern 113 may include, for example, silicon oxide.

A gate electrode 120a crosses over the semiconductor fin 110, and a gate interlayer insulating layer 115 is between the gate electrode 120a and the semiconductor fin 110. The gate insulating layer 115 includes a first portion provided on a central portion of an upper surface of the semiconductor fin 110, a second portion provided on edges (including the rounded upper corners) of the upper surface of the semiconductor fin 110, and a third portion formed on side surfaces of the semiconductor fin 110. In some embodiments of the present invention, the first portion of the gate insulating layer 115 may be thinner than the second portion of the gate insulating layer 115. The gate electrode 120a may include, for example, doped polysilicon, metal (e.g., tungsten or molybdenum), conductive metal nitride (e.g., titanium nitride or tantalum nitride), and/or metal silicide (e.g., tungsten silicide or cobalt silicide). In particular, the lower portion of the gate electrode 120a may include, for example, doped polysilicon. The gate insulating layer 115 may include silicon oxide, for example, thermal oxide.

In the semiconductor fin 110 at either side of the gate electrode 120a, a pair of doped regions 130 are provided. The pair of doped regions 130 provided in the semiconductor fin 110 at either side of the gate electrode 120a may provide source/drain regions of a fin transistor according to some embodiments of the present invention. A channel region 170 having a three-dimensional structure is defined at the semiconductor fin 110 under the gate electrode 120a. In other words, the channel region 170 is defined at the semiconductor fin 110 provided between the pair of doped regions 130. The channel region 170 includes a pair of first side surfaces, which contact the pair of doped regions 130, respectively, and a pair of second side surfaces, which are perpendicular to the pair of first side surfaces. The pair of second side surfaces are opposite to each other. The gate electrode 120a is provided on the upper surface and the pair of second side surfaces of the channel region 170.

The doped region 130 has a recess region 125. The recess region 125 is provided in a central portion of the upper surface of the doped region 130. The edge of the upper surface of the doped region 130 is higher than the bottom surface of the recess region 125. In other words, all inner surfaces of the recess region 125 are formed by the doped region 130. In some embodiments of the present invention, the bottom surface of the recess region 125 has a height close to the lower surface of the channel region 170. In particular, the bottom surface of the recess region 125 may be lower than the lower surface of the channel region 170. In some embodiments of the present invention, the recess region 125 is spaced apart from the channel region 170. As illustrated in the Figures, the recess region 125 may be provided in each of the pair of doped regions 130. The gate electrode 120a and the doped region 130 having the recess region 125 may provide a fin transistor.

An interlayer insulating layer 135 is provided on a surface of the substrate 100 including the gate electrode 120a and the doped region 130 having the recess region 125. The interlayer insulating layer 135 may include, for example, silicon oxide. An opening 140 is formed such that it penetrates the interlayer insulating layer 135 so as to expose at least a portion of the doped region 130. In particular, the opening 140 exposes at least a portion of the recess region 125. A vacant space of the opening 140 and a vacant space of the recess region 125 exposed to the opening 140 are shared. The opening 140 may be hole-shaped and a connector region 145 may fill the opening 140 and the recess region 125 exposed to the opening 140. In other words, the connector region 145 contacts the inner surfaces and bottom surface of the recess region 125 exposed to the opening 140.

It some embodiments of the present invention the connector region 145 may include, for example, a material of having a resistivity that is lower than that of the doped region 130. For example, the connector region 145 may include conductive metal nitride (e.g., titanium nitride or tantalum nitride), metal (e.g., titanium, tantalum, tungsten, aluminum or copper), and/or metal silicide (e.g., titanium silicide or tantalum silicide). The connector region 145 may be pillar-shaped because the opening 140 may be hole-shaped.

An interconnection 150 may be provided on the interlayer insulating layer 135. The interconnection 150 is connected to the connector region 145. The interconnection 150 crosses over the gate electrode 120a. The interconnection 150 may include a conductive metal nitride (e.g., titanium nitride or tantalum nitride), and/or metal (e.g., titanium, tantalum, tungsten, aluminum or copper). The interconnection 150 may provide a bit line of the semiconductor device.

According to some embodiments of the present invention, the recess region 125 is provided in the doped region 130, and the connector region 145 of low resistivity material contacts the inner surfaces of the recess region 125, i.e., the inner surfaces formed by the doped region 130. Accordingly, a current path between the lower portion of the channel region 170 and the connector region 145, i.e., the current path through the doped region 130, may be very similar or even identical to a current path between the upper portion of the channel region 170 and the connector region 145. As a result, the resistance between the lower portion of the channel region 170 and the connector region 145 may be remarkably reduced. Therefore, it may be possible to increase the amount of driving current flowing through the lower portion of the channel region 170. Particularly, since the bottom surface of the recess region 125 has the height close to the lower surface of the channel region 170, it may be possible to secure the sufficient amount of driving current all over the channel region including the lower portion as well as the upper portion. Thus, according to some embodiments of the present invention, it may be possible to provide a semiconductor device having the channel region with a three-dimensional structure by which the amount of driving current increases.

The connector region 145 and the doped region 130 having the recess region 125 according to some embodiments of the present invention may be applied to a nonvolatile memory cell having a channel region having a three-dimensional structure, which will be more fully illustrated with reference to the accompanying Figures. Like reference numerals refer to like elements throughout the specification.

Figure 4A:
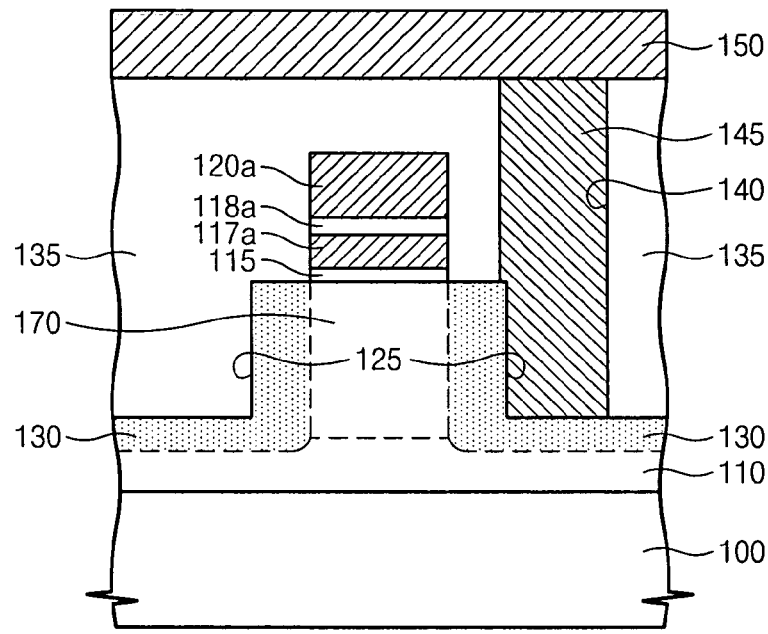
FIGS. 4A and 4B are cross-sections taken along lines C-C' and E-E' of FIG. 2, respectively, and illustrate semiconductor devices according to some embodiments of the present invention.
Figure 4B:
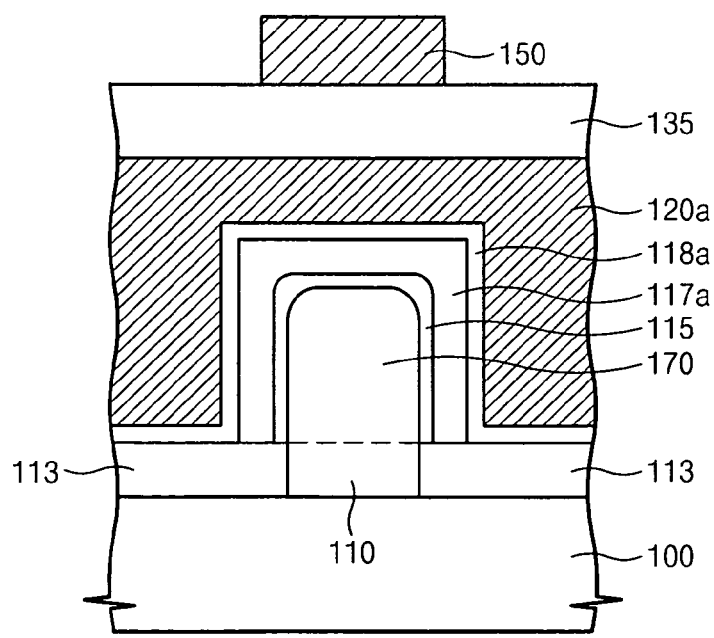

FIGS. 4A and 4B are cross-sections taken along lines C-C' and E-E' of FIG. 2, respectively, and illustrate semiconductor devices according to some embodiments of the present invention. Referring now to FIGS. 4A and 4B, a floating gate 117a is provided between the gate electrode 120a and the gate insulating layer 115. The floating gate 117a is provided on an upper surface as well as both side surfaces of the channel region 170. A blocking insulating pattern 118a is provided between the floating gate 117a and the gate electrode 120a. The floating gate 117a is electrically insulated from the channel region 170 and the gate electrode 120a by the gate insulating layer 115 and the blocking insulating pattern 118a, respectively. Each of the floating gate 117a and the blocking insulating pattern 118a has both sidewalls aligned with the gate electrode 120a. In some embodiments, charges penetrate the gate insulating layer 115 by tunneling effect so that they may be transferred to or away from the floating gate 117a.

The floating gate 117a may include, for example, polysilicon. The blocking insulating pattern 118a may include an oxide-nitride-oxide (ONO) layer. In some embodiments of the present invention, the blocking insulating pattern 118a may include, for example, a high dielectric layer of which a dielectric constant is higher than that of the gate insulating layer 115. For example, the blocking insulating pattern 118a may include an insulating metal oxide layer, such as a hafnium oxide layer, an aluminum oxide layer or the like.

The doped region 130 is provided in the semiconductor fin 110 at either side of the floating gate 117a, i.e., the semiconductor fin 110 at either side of the gate electrode 120a. The doped region 130 has the recess region 125 as described above, and the connector region 145 penetrating the interlayer insulating layer 135 is in contact with the inner surfaces of the recess region 125, which is formed by the doped region 130.

Since a nonvolatile memory device also includes the doped region 130 having the recess region 125 and the connector region 145 in contact with the inner surfaces of the recess region 125, it may be possible to obtain the same effect as mentioned above with respect to FIGS. 3A, 3B and 3C. In other words, it may be possible to increase the amount of driving current flowing through the lower portion of the channel region 170.

The connector region 145 and the doped region 130 having the recess region 125 according to some embodiments of the present invention may be applied to a transistor device including a channel region of various types of three-dimensional structures. Another shape of the channel region will be discussed with reference to the accompanying figures. Like reference numerals refer to like elements throughout the specification.

Figure 5A:
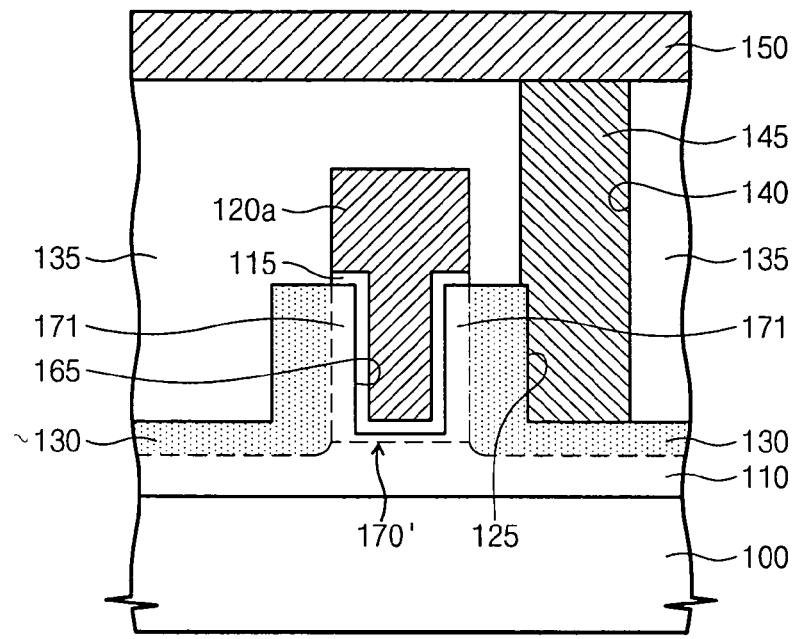
FIGS. 5A and 5B are cross-sections taken along lines C-C' and E-E' of FIG. 2, respectively, and illustrate semiconductor device according to some embodiments of the present invention.
Figure 5B:
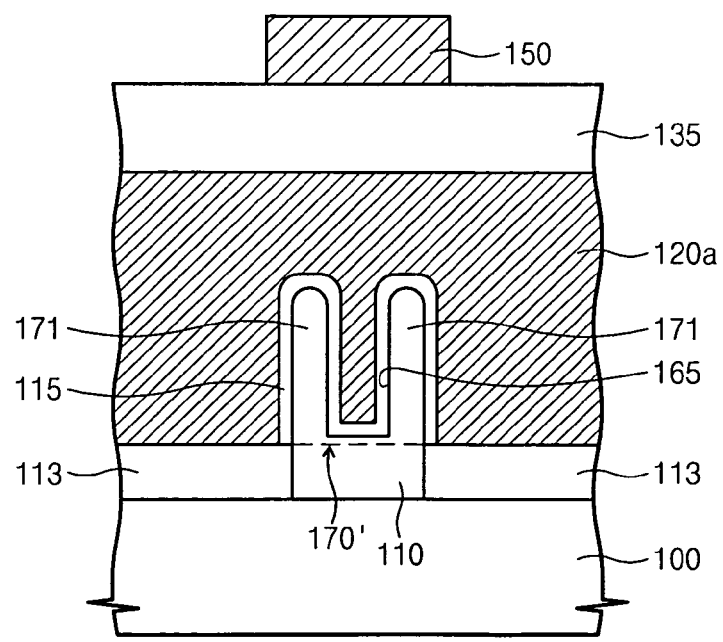

FIGS. 5A and 5B are cross-sections taken along lines C-C' and E-E' of FIG. 2, respectively, and illustrate channel regions included in the semiconductor devices according to some embodiments of the present invention. Referring now to FIGS. 5A and 5B, a channel region 170' under the gate electrode 120a has a channel recess region 165. The channel recess region 165 is a region provided at a central portion of an upper surface of the channel region 170'. Due to the channel recess region 165, the channel region 170' has a pair of channel fins 171 which are opposite to each other. The gate insulating layer 115 is conformally provided on bottom and inner surfaces of the channel recess region 165, and the gate electrode 120a fills the channel recess region 165.

The doped region 130 having the recess region 125 is provided at either side of the channel region 170' having the channel recess region 165, and the connector region 145 penetrating the interlayer insulating layer 135 is in contact with the inner surfaces of the recess region 125.

According to some embodiments of the present invention, both side surfaces of the pair of the channel fins 171 are used as the channel so that the channel width of the fin transistor may be increased within a limited area. Furthermore, since the connector region 145 is in contact with the inner surfaces of the recess region 125, there may be a reduced resistance between the lower portion of the channel region 170' and the connector region 145, where the lower portion of the channel region 170' incorporates the lower portions of the pair of the channel fins 171. As a result, it may be possible to increase the amount of driving current flowing through the lower portion of the channel region 170'.

The semiconductor device of the present invention may have another three-dimensional structure besides the channel region 170' of FIGS. 5A and 5B.

The connector region 145, which is in contact with the doped region 130 having the recess region 125, may have be pillar-shaped as discussed above. In some embodiments of the present invention, the connector region 145 contacting the doped region 130 may have different shapes, which will be illustrated with reference to the accompanying figures. Like reference numerals also denote like elements throughout the specification.

Figure 6A:
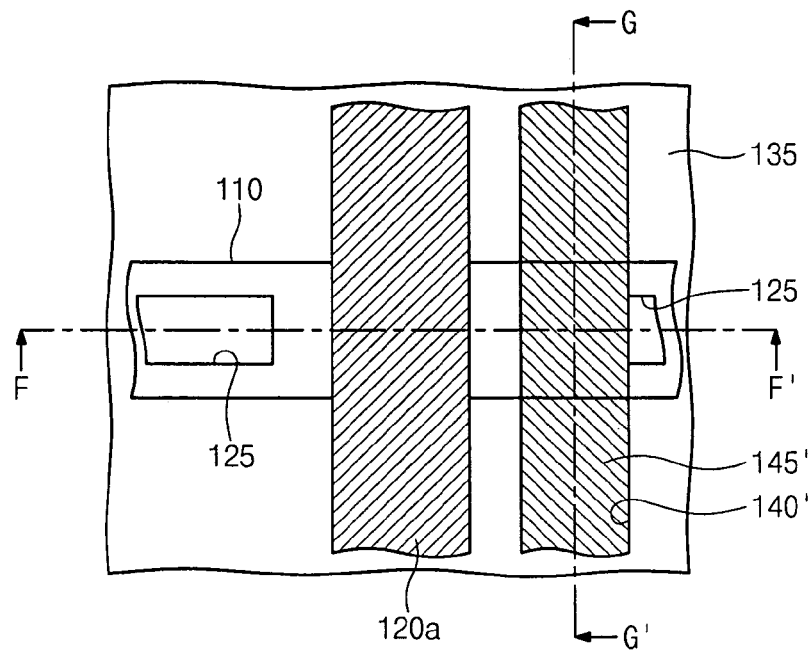
FIG. 6A is a plan view illustrating semiconductor devices according to some embodiments of the present invention.
Figure 6B:
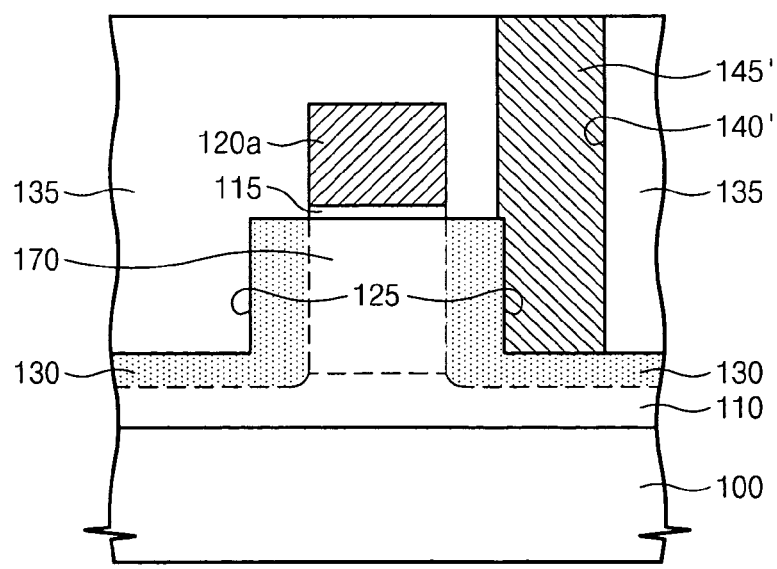
FIGS. 6B and 6C are cross-sections taken along lines F-F' and G-G' of FIG. 6A, respectively.
Figure 6C:
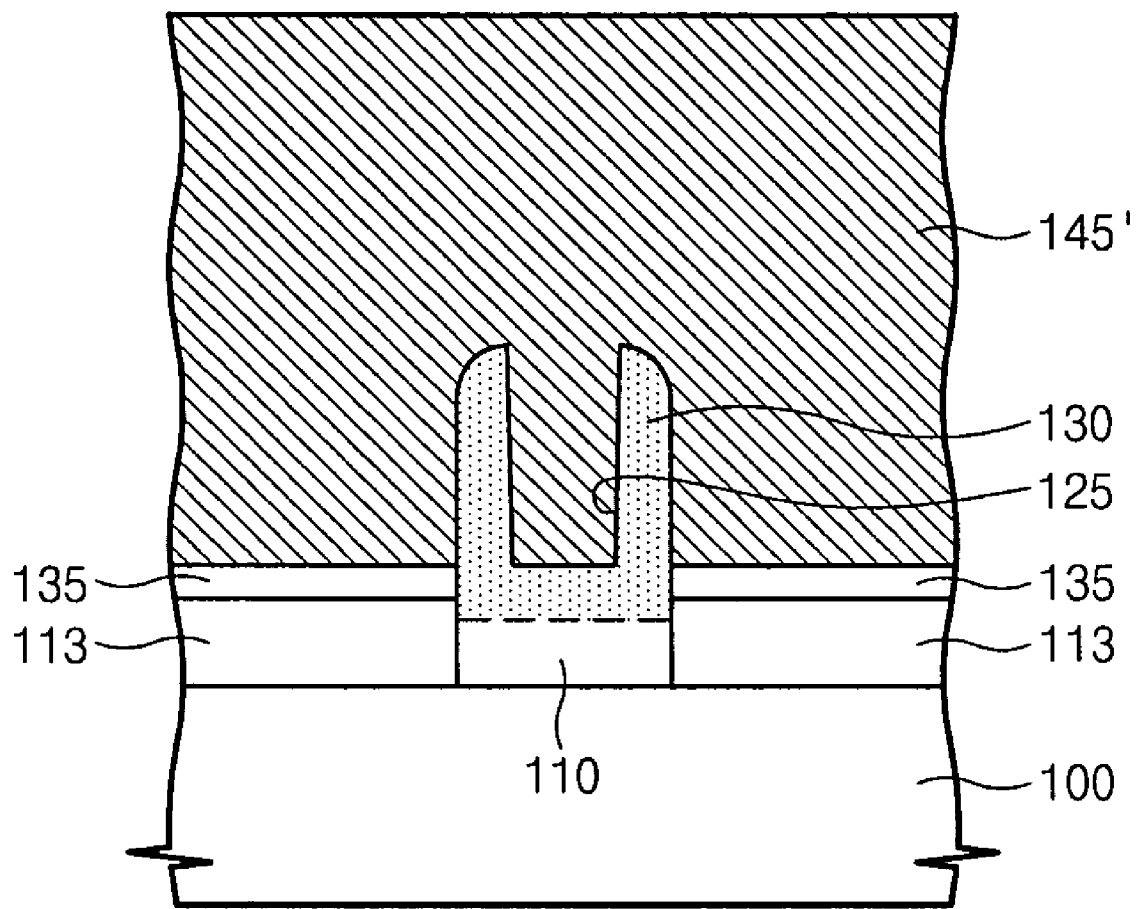

FIG. 6A is a plan view illustrating a connector region included in semiconductor devices according to some embodiments of the present invention, and FIGS. 6B and 6C are cross-sections taken along lines F-F' and G-G' of FIG. 6A, respectively. Referring now to FIGS. 6A, 6B and 6C, the doped region 130 having the recess region 125 is provided in the semiconductor fin 110 at either side of the gate electrode 120a, and the interlayer insulating layer 135 covers the entire surface of the substrate 100. An opening 140' is provided such that it penetrates the interlayer insulating layer 135 to expose at least a portion of the recess region 125. The opening 140' may have a groove-shaped which crosses over the doped region 130 having the recess region 125. The opening 140' is provided parallel to the gate electrode 120a. The opening 140' exposes outer surfaces of the doped region 130 thereunder.

The connector region 145' fills the opening 140' and the recess region 125 exposed to the opening 140'. The connector region 145 may have a line-shape due to the opening 140'. In some embodiments of the present invention, the connector region 145' may include a conductive material having a lower resistivity than the doped region 130. For example, the connector region 145' may include conductive metal nitride (e.g., titanium nitride or tantalum nitride), metal (e.g., titanium, tantalum, tungsten, aluminum or copper), and/or metal silicide (e.g., titanium silicide or tantalum silicide). The connector region 145' contacts both the inner surfaces of the recess region 125 exposed to the opening 140' and the outer surfaces of the doped region 130. The line-shaped connector region 145' may be used as a source line.

The semiconductor device having the connector region 145' and the doped region 130 may provide the same effect as illustrated in FIGS. 3A, 3B and 3C. Furthermore, the connector region 145' is in contact with the outer surfaces of the doped region 130 as well as the inner surfaces of the recess region 125 exposed to the opening 140'. Accordingly, the area of the connector region 145' provided close to the upper and lower portions of the channel region 170 may be increased and thus, it may be possible to further reduce the resistance between the upper and lower portions of the channel region 170 and the connector region 145'. Accordingly, it may be possible to provide the fin transistor having an increased amount of driving current.

The line-shaped connector region 145' and the doped region 130 may be applied to the nonvolatile memory cell discussed above with respect to FIGS. 4A and 4B. In other words, between the gate electrode 120a and the gate insulating layer 115 of FIGS. 6B and 6C, there may be provided the floating gate 117a and the blocking insulating pattern 118a of FIGS. 4A and 4B. Furthermore, the channel region 170 of FIGS. 6B and 6C may be substituted by the channel region 170' having the pair of channel fins 171 of FIGS. 5A and 5B.

Methods of forming semiconductor devices according to some embodiments of the present invention will be discussed with respect to the accompanying Figures. FIGS. 7 through 10 are cross-sections taken along the lines C-C', D-D' and E-E' of FIG. 2, respectively, and illustrated processing steps in the fabrication of semiconductor devices according to some embodiments of the present invention. In the figures, reference numeral "51", "52" and "53" denote cross-sections taken along the lines C-C', D-D' and E-E' of FIG. 2, respectively.

Figure 7:
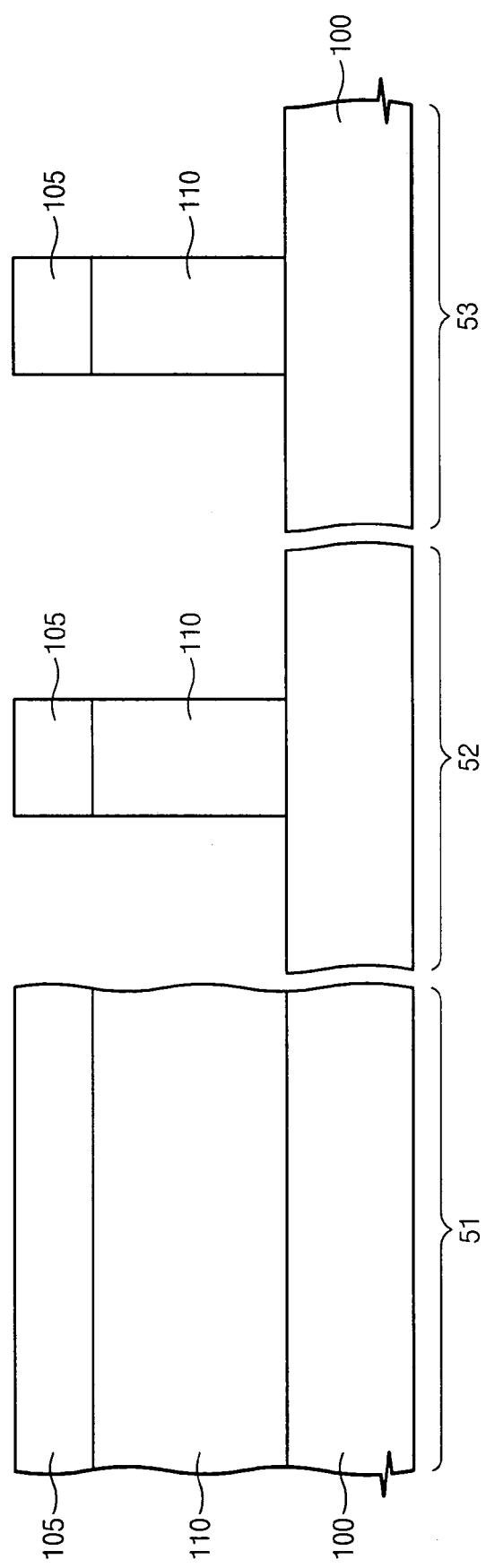
FIGS. 7 through 10 are cross-sections taken along the lines C-C', D-D' and E-E' of FIG. 2, respectively, and illustrate processing steps in the fabrication of semiconductor devices according to some embodiments of the present invention.

Referring now to FIG. 7, a hard mask pattern 105 is formed on a region of a substrate 100 by patterning a hard mask layer (not shown) into a desired shape. Thereafter, the substrate 100 is etched using the hard mask pattern 105 as a mask to thereby form a semiconductor fin 110. The substrate 100 may be a bulk substrate or a silicon on insulator (SOI) substrate. The hard mask pattern 105 may include a material having an etch selectivity with respect to the substrate 100. For example, the hard mask pattern 105 may include silicon nitride. The hard mask pattern 105 may further include a buffer oxide layer between the silicon nitride layer and the substrate 100 without departing from the scope of the present invention.

Figure 8:
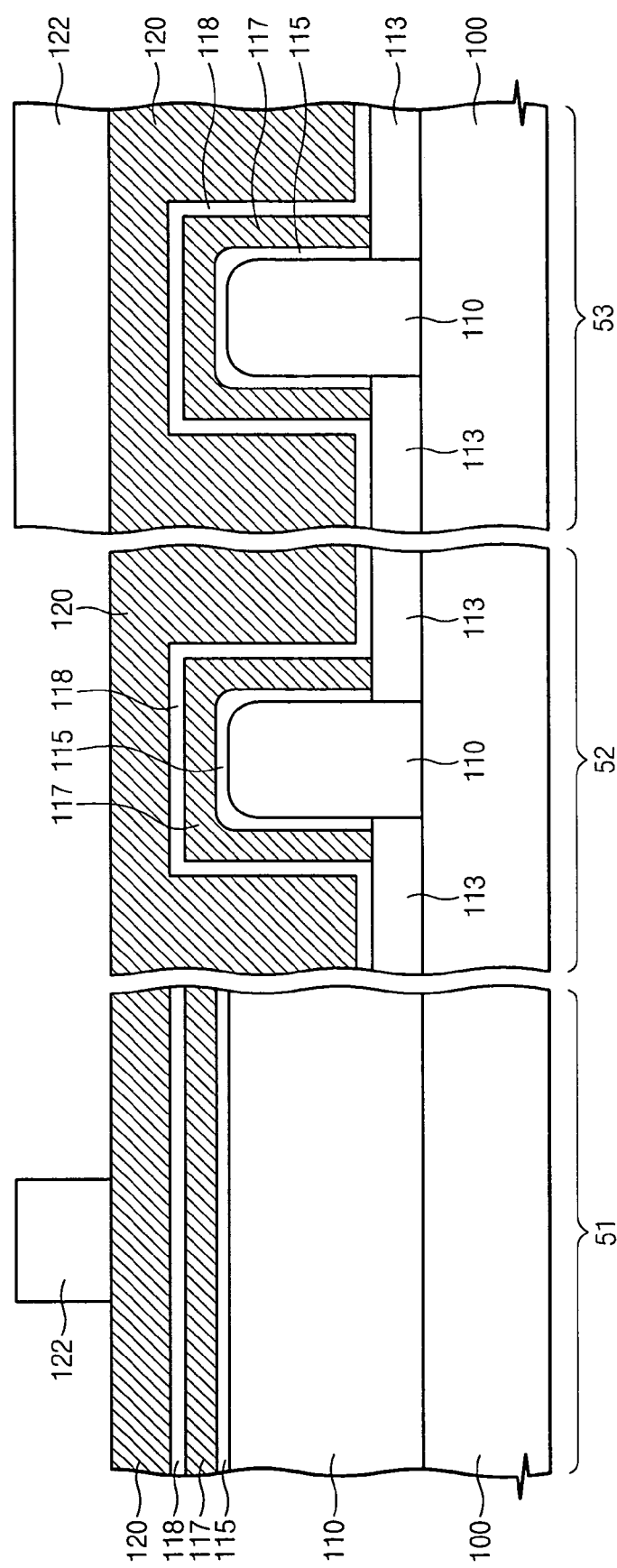

Referring now to FIG. 8, a device isolation insulating layer is formed on the entire surface of the substrate 100, and then planarized until the hard mask pattern 105 is at least partially exposed. Thereafter, the planarized device isolation insulating layer is recessed so as to form a device isolation pattern 113 including a lower portion of the semiconductor fin 110. Afterwards, the hard mask pattern 105 is removed. The hard mask pattern 105 may be removed after forming the planarized device isolation insulating layer.

Before forming the device isolation insulating layer, a trimming process may be performed over the semiconductor fin 110. The trimming process is a process of adjusting the width of the semiconductor fin 110 as well as smoothing the side surface of the semiconductor fin 110 by performing oxidation process and a removal process of an oxidized portion of the semiconductor fin 110. The trimming process may be repeatedly performed at least once or more.

Subsequently, a upper corner of the semiconductor fin 110 may be rounded. Through the trimming process, the upper corner of the semiconductor fin 110 may become rounded. In some embodiments of the present invention, after removing the hard mask pattern 105 and forming the device isolation pattern 113, the upper corner of the semiconductor fin 110 may be rounded by repeatedly performing oxidation and rinsing processes over the semiconductor fin 110 at least once or more.

A gate insulating layer 115 is formed on upper and side surfaces of the semiconductor fin 110 having the rounded upper corner. At this time, a gate insulating layer 115 formed on a central portion of the upper surface of the semiconductor fin 110 may be formed thinner than the gate insulating layer 115 formed on edges of the upper surface of the semiconductor fin 110. Hereinafter, the central portion of the upper surface of the semiconductor fin 110 is referred to as the central upper surface, and the edge of the upper surface thereof is referred to as the edge upper surface.

In some embodiments of the present invention, the gate insulating layer includes thermal oxide. This may make it possible to form the gate insulating layer 115 formed on the edge upper surface of the semiconductor fin 110 having the rounded upper corners thicker than the gate insulating layer 115 formed on the central upper surface of the semiconductor fin 110.

A floating gate layer is formed on the substrate 100 having the gate insulating layer 115, and it is then patterned to form a preliminary floating gate 117 covering the upper and side surfaces of the semiconductor fin 110. The preliminary floating gate 117 may include polysilicon. Thereafter, a blocking insulating layer 118 is conformally formed on the substrate 100 having the preliminary floating gate 117. The blocking insulating layer 118 may include oxide-nitride-oxide (ONO) layer. In some embodiments of the present invention, the blocking insulating pattern 118 may include a high dielectric layer of which a dielectric constant is higher than that of the gate insulating layer 115. For example, the blocking insulating pattern 118a may include an insulating metal oxide layer such as a hafnium oxide layer, an aluminum oxide layer or the like. A gate conductive layer 120 is formed on the blocking insulating layer 118. The gate conductive layer 120 may include, for example, doped polysilicon, metal (e.g., tungsten or molybdenum), conductive metal nitride (e.g., titanium nitride or tantalum nitride), and/or metal silicide (e.g., tungsten silicide or cobalt silicide). In particular, the lower portion of the gate conductive layer 120 may include doped polysilicon.

Afterwards, a gate mask pattern 122 is formed on the gate conductive layer 120. The gate mask pattern 122 crosses over the semiconductor fin 110. The gate mask pattern 122 may include photoresist pattern.

Figure 9:
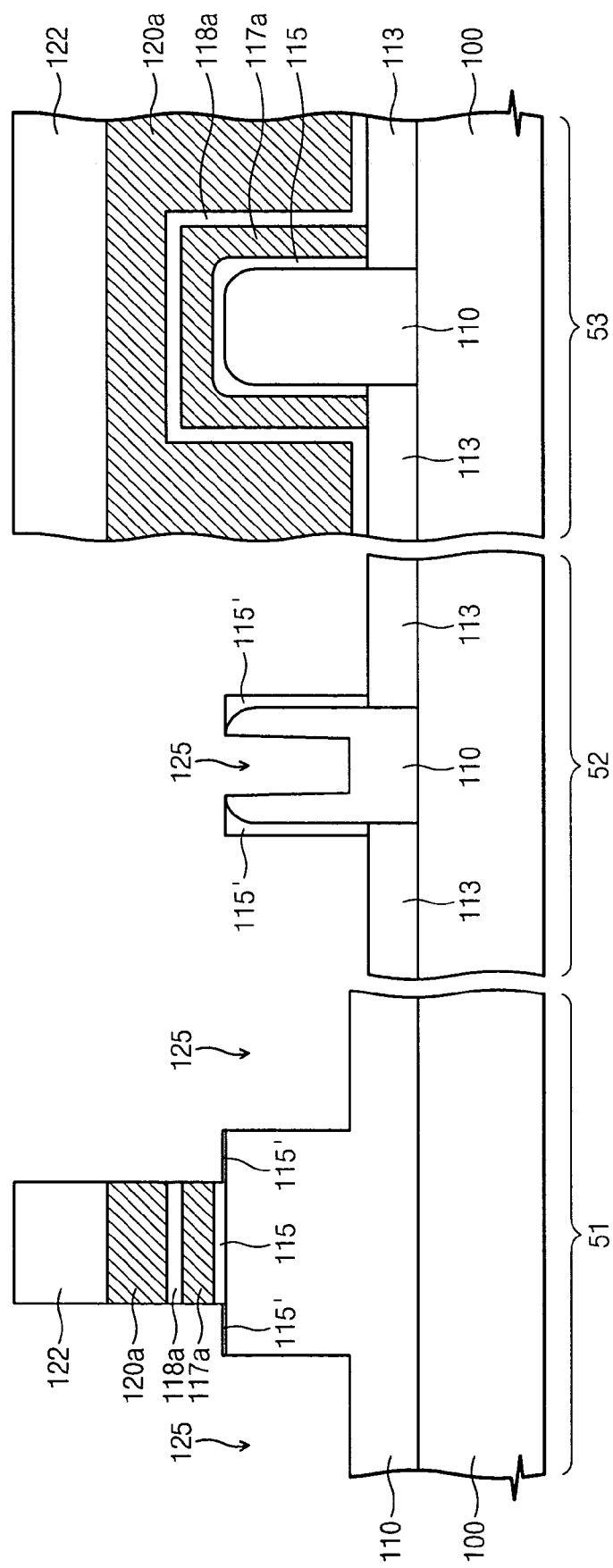

Referring now to FIG. 9, the gate conductive layer 120, the blocking insulating layer 118 and the preliminary floating gate 117 are subsequently etched using the gate mask pattern 122 as an etch mask to thereby form a floating gate 117a, a blocking insulating pattern 118a and a gate electrode 120a which are stacked in sequence. Thereafter, an over-etching process is performed using the gate mask pattern 122 as an etch mask so as to form a recess region 125 in the semiconductor fin 110 provided at either side of the gate electrode 120a.

In some embodiments of the present invention, an etch rate of the semiconductor fin 110 may be higher than the etch rate of the gate insulating layer 115 during the over-etching process. The relatively thin gate insulating layer 115 is removed by the over-etching process so that the central upper surface of the semiconductor fin 110 is exposed and the exposed central upper surface is then etched to thereby form the recess region 125. While the central upper surface of the semiconductor fin 110 is etched by the over-etching, the edge upper surface of the semiconductor fin 110 where the relatively thick gate insulating layer 115 is formed is protected by a residue 115' of the gate insulating layer. Furthermore, while the recess 125 is formed, the residue 115' of the gate insulating layer also remains on the central upper surface of the semiconductor fin 110 adjacent to the gate electrode 120a. This is caused by a loading effect that the etching of the region adjacent to the gate electrode 120a becomes slower than the etching of a broader region.

Accordingly, through the over-etching process, the recess region 125 may be formed such that it is separated from the channel region defined under the gate electrode 120a. The etching process of patterning the preliminary floating gate 117 using the gate mask pattern 122 and the over-etching process may performed successively.

Figure 10:
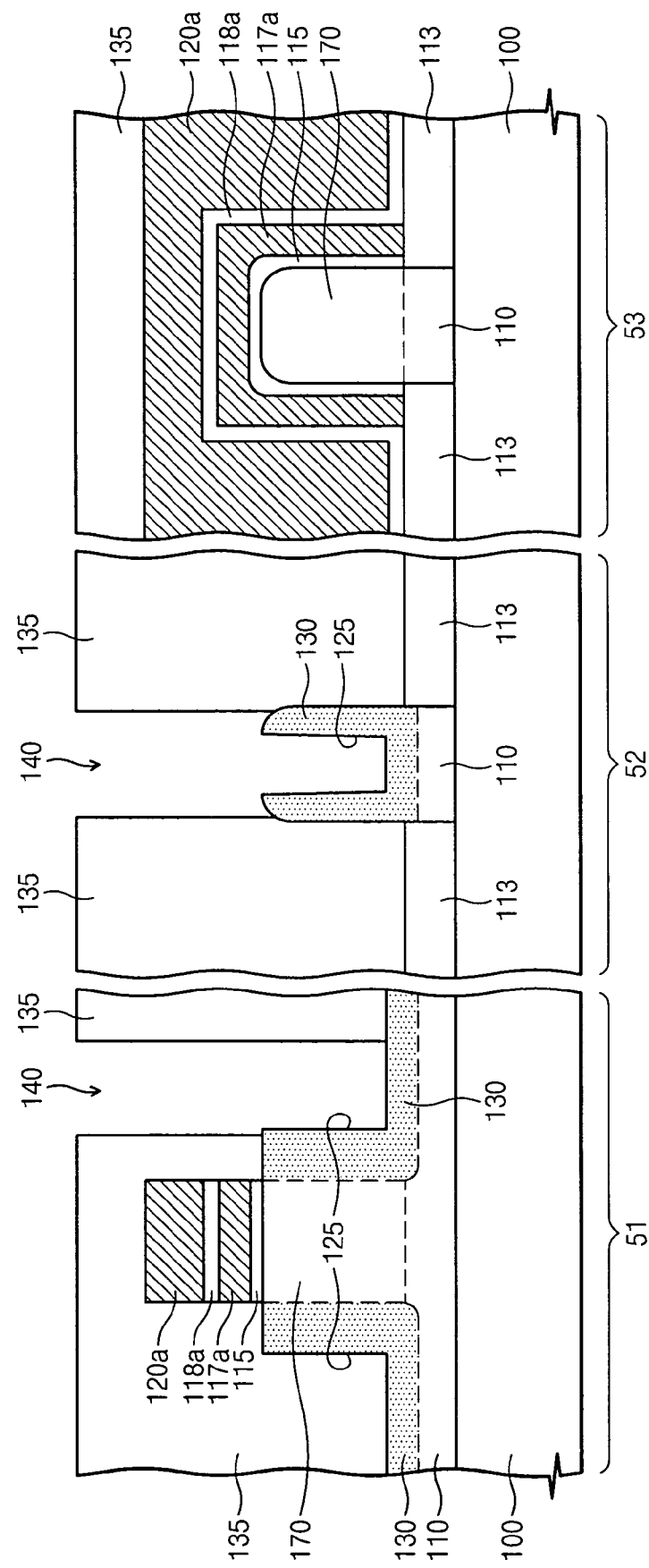

Referring now to FIG. 10, the gate mask pattern 122 is removed. Subsequently, ions are implanted into the semiconductor fin 110 having the recess region 125 at either side of the gate electrode 120a, thereby forming a doped region 130. In some embodiments of the present invention, the ions are implanted into the semiconductor fin 110 having the recess region 125 using, for example, an isotropic ion implantation process, i.e., plasma doping process. Accordingly, the bottom and inner surfaces of the recess region 125 may be formed by the doped region 130. In some embodiments of the present invention, the ions may be implanted by implant-method. In these embodiments, the ions may be implanted at a predetermined tilt angle.

The residue 115' of the gate insulating layer at either side of the gate electrode 120a may be removed by a rinsing process after the removal of the gate mask pattern 122 or a rinsing process after the forming of the doped region 130. An interlayer insulating layer 135 is formed on the surface of the substrate 100. The interlayer insulating layer 135 fills the recess region 125. The interlayer insulating layer 135 may include silicon oxide. The interlayer insulating layer 135 is patterned so as to form an opening 140 which exposes at least a portion of the recess region 125. At this time, the bottom and inner surfaces of the recess region 125 exposed to the opening 140 are exposed also. The opening 140 may be hole-shaped. Thereafter, a connector region 145 of FIG. 4A is formed to fill the opening 140 and the recess region 125 exposed to the opening 140, and an interconnection 150 of FIG. 4A. Accordingly, it may be possible to provide the semiconductor device of FIGS. 4A and 4B.

Methods of forming semiconductor device of FIGS. 3A, 3B and 3C will be discussed. Method for forming the semiconductor devices of FIGS. 3A, 3B and 3C may be very similar or even identical to the methods discussed above with reference to FIGS. 7 through 10, except the processes of forming the preliminary floating gate 117 and the blocking insulating layer 118 which were discussed above with respect to FIG. 8. In these embodiments of the present invention, the gate conductive layer 120 of FIG. 8 is directly formed on the gate insulating layer 115, and then the gate electrode 120a is formed by etching the gate conductive layer 120 using the gate mask pattern 122 as an etch mask. Furthermore, the over-etching is performed using the gate mask pattern 122 as an etch mask so as to form the recess region 125. The other processes are similar to those of the method discussed above.

Methods of forming semiconductor devices of FIGS. 5A and 5B will be discussed with reference to the accompanying figures. This method may include the method of forming the semiconductor fin 110 as discussed above with respect to FIG. 7. FIGS. 11 through 14 are cross-sections taken along the lines C-C' and E-E' of FIG. 2, respectively, and illustrated processing steps in the fabrication of semiconductor devices illustrated in FIGS. 5A and 5B according to some embodiments of the present invention.

Figure 11:
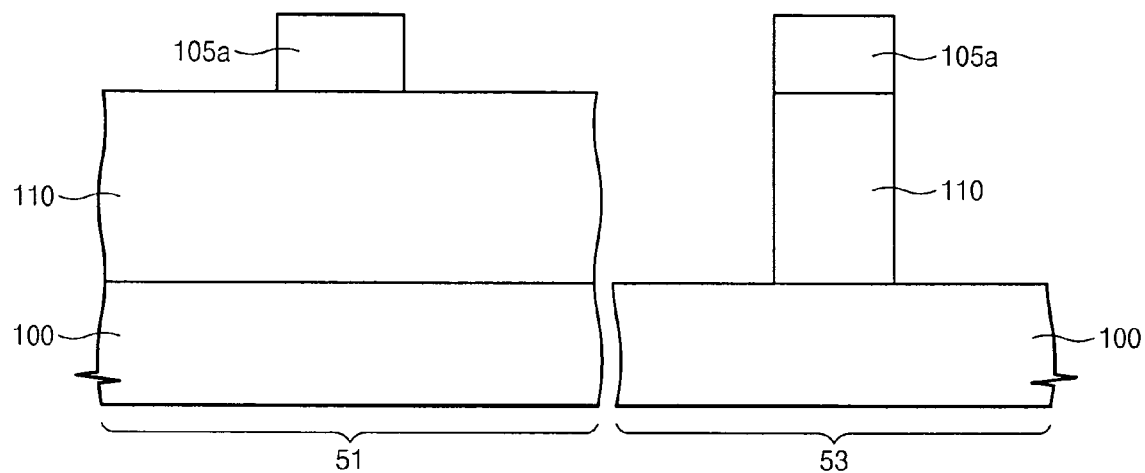
FIGS. 11 through 14 are cross-sections taken along the lines C-C' and E-E' of FIG. 2, respectively, and illustrate processing steps in the fabrication of semiconductor devices of FIGS. 5A and 5B.

Referring to FIGS. 7 and 11, the hard mask pattern 105 is patterned to form a channel capping pattern 105a after forming a semiconductor fin 110. Herein, the channel capping pattern 105a has a pair of first side surfaces aligned with the side surface of the semiconductor fin 110, and a pair of second side surfaces perpendicular to the pair of the first side surfaces. An upper surface of the semiconductor fin 110 nearby the second side surfaces is exposed.

Figure 12:
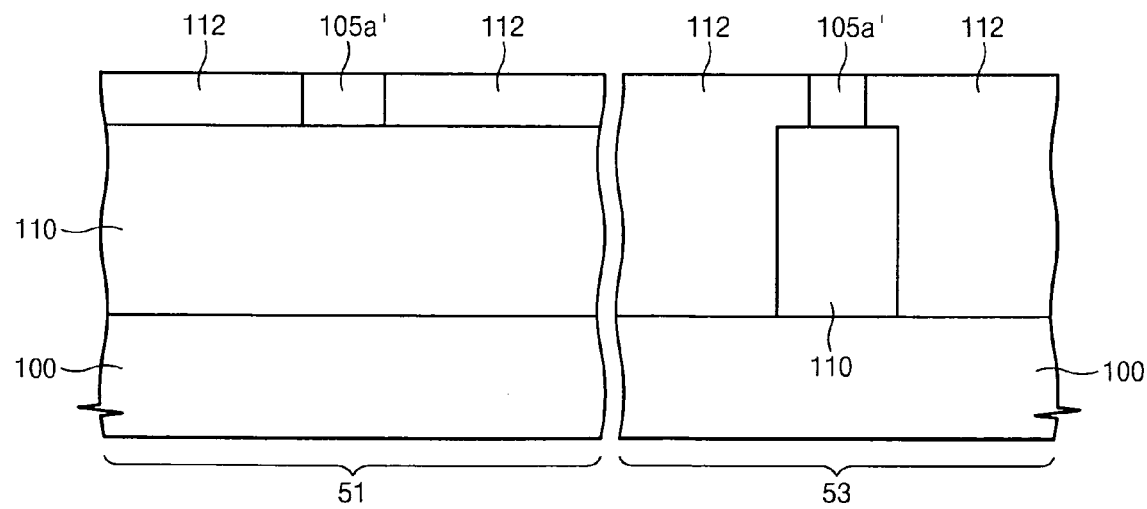

Referring now to FIG. 12, the channel capping pattern 105a is isotropically etched. Accordingly, there is exposed an edge upper surface of the semiconductor fin 110 nearby the first side surfaces of the isotropic-etched channel capping pattern 105a'.

A device isolation insulating layer is formed on the surface of the substrate 100, and it is planarized until the isotropic-etched channel capping pattern 105a' is exposed. The planarized device isolation insulating layer 112 covers the edge upper surface of the semiconductor fin 110 nearby the first side surfaces of the isotropic-etched channel capping pattern 105a' and the upper surface of the semiconductor fin 110 nearby the second side surfaces of the isotropic-etched channel capping pattern 105a'. The planarized device isolation layer 112 may include an insulating material having an etch selectivity with respect to the semiconductor fin 110 and the isotropic-etched channel capping pattern 105a'. For example, the planarized device isolation layer 112 may include silicon oxide.

Figure 13:
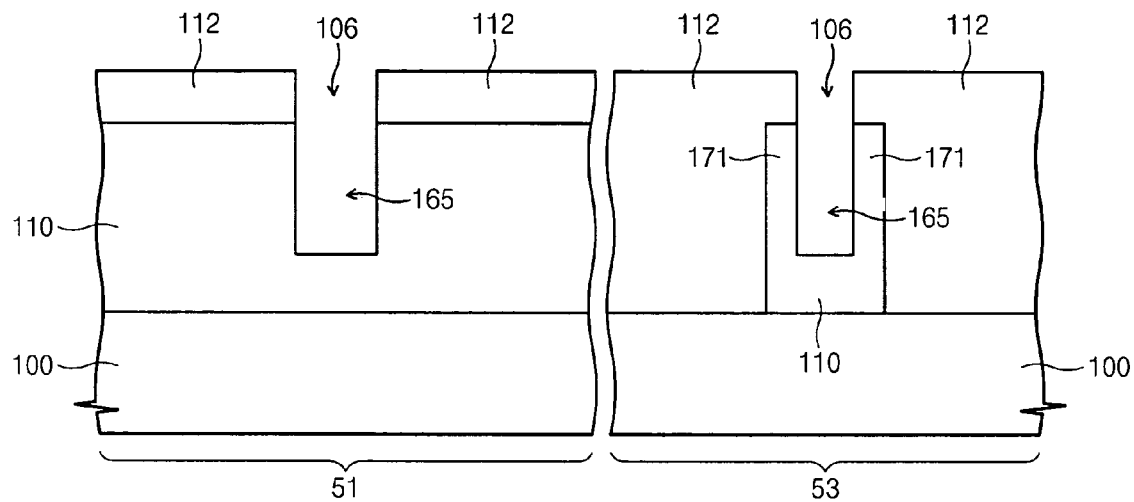

Referring now to FIG. 13, the isotropic-etched channel capping pattern 105a' is removed so as to form a channel opening 106 exposing the semiconductor fin 110. The semiconductor fin 110 exposed by the channel opening 106 is etched to form a channel recess region 165. Thus, a pair of channel fins 171 are formed by virtue of the channel recess region 165.

Figure 14:
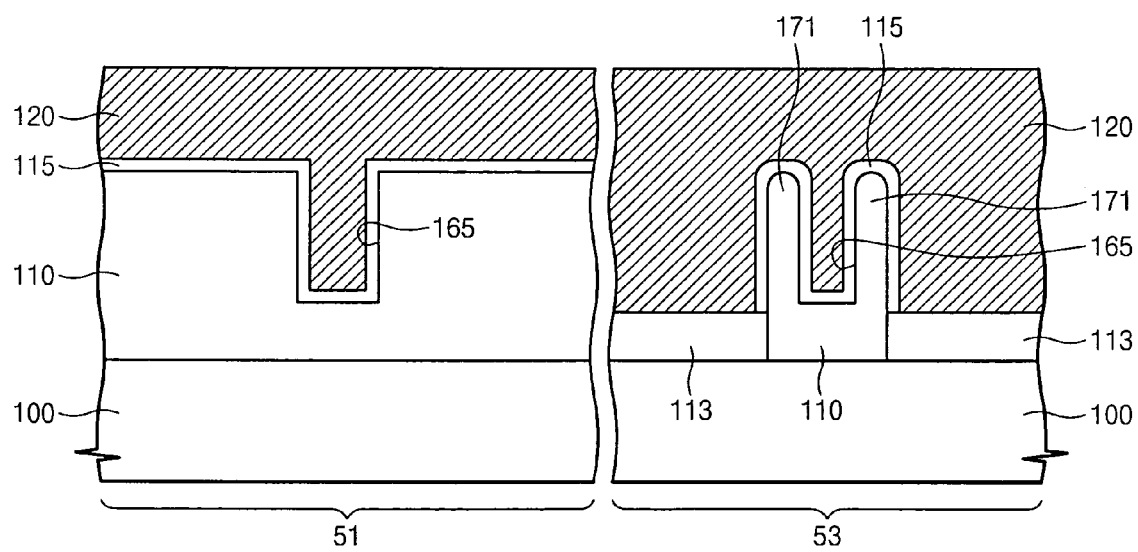

Referring now to FIG. 14, the planarized device isolation layer 112 is recessed so as to form a device isolation pattern 113 including the lower portion of the semiconductor fin 110. The planarized device isolation layer 112 may be recessed by isotropic etching, for example, a wet etching process.

The upper corner of the semiconductor fin 110 is made to be rounded. At this time, the upper corners of the channel fins 171 may become rounded, too. Methods of making the upper corner of the semiconductor fin 110 rounded may be performed by the same or similar method discussed above with respect to FIG. 8.

A gate insulating layer 115 is formed on the surface of the semiconductor fin 110. At this time, the gate insulating layer 115 is conformally formed on the inner and bottom surfaces of the channel recess region 165. Of course, the gate insulating layer 115 formed on the central upper surface of the semiconductor fin 110 at either side of the channel recess region 165 is formed thinner than the gate insulating layer 115 formed on the edge upper surface of the semiconductor fin 110 of the channel recess region 165. Subsequently, a gate conductive layer 120 is formed on the gate insulating layer 115 such that it fills the channel recess region 165.

The gate conductive layer 120 is patterned to form a gate electrode 120a of FIGS. 5A and 5B. In this case, the gate electrode 120a fills the channel recess region 165. Thereafter, the over-etching is performed subsequent to the etching process included in the patterning process, thereby forming the recess region 125 in the semiconductor fin 110 at either side of the gate electrode 120a. Other processes may be performed as discussed above with respect to FIG. 10.

Methods of forming semiconductor devices illustrated in FIGS. 6A, 6B and 6C will be discussed. A characteristic part of this method is performed after forming the interlayer insulating layer 110. In other words, this method may include all the processes from the forming of the semiconductor fin 110 to the forming of the interlayer insulating layer 135 which are discussed above with respect to FIGS. 4A and 4B. In some embodiments of the present invention, this method may include all the processes from the forming of the semiconductor fin 110 to the forming of the interlayer insulating layer 135 which are discussed above with respect to FIGS. 3A, 3B and 3C. In some embodiments of the present invention, this method may include all the processes from the forming of the semiconductor fin 110 to the forming of the interlayer insulating layer 135 which are discussed above with respect to FIGS. 5A and 5B.

Figure 15:
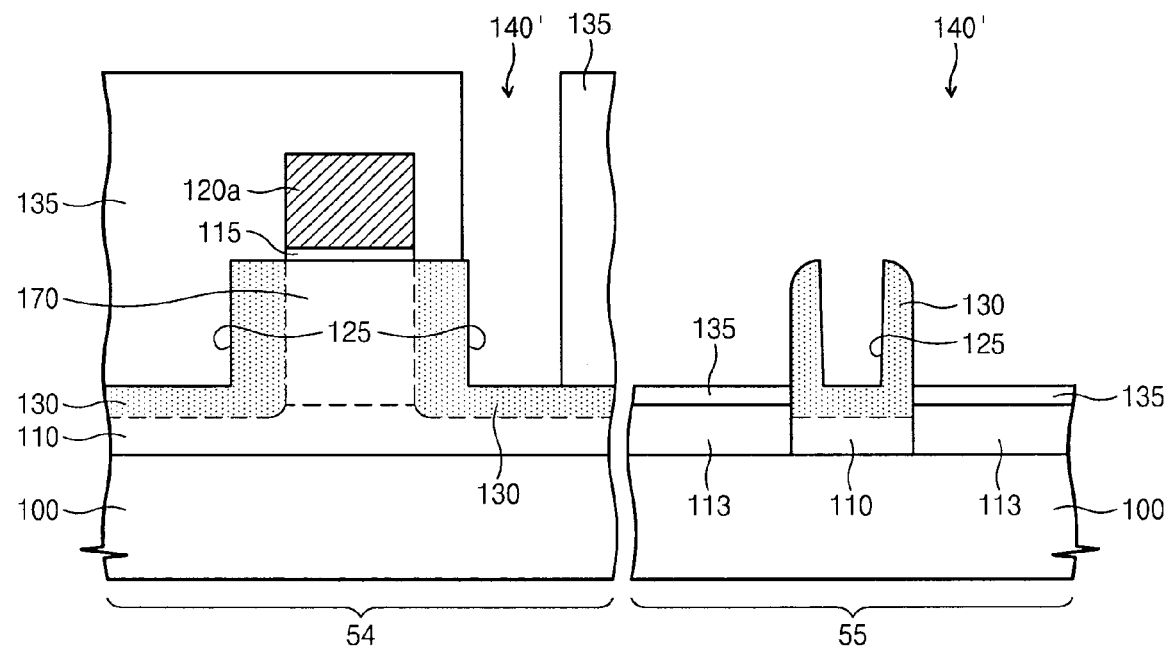
FIG. 15 is a cross-section taken along the lines F-F' and G-G' of FIG. 6A, and illustrates processing steps in the fabrication of semiconductor devices of FIGS. 6A, 6B and 6C.

The characteristic part of the method of forming the semiconductor device of FIGS. 6A, 6B and 6C will be illustrated with reference to the accompanying figures. FIG. 15 is a cross-section taken along the lines F-F' and G-G' of FIG. 6A, and illustrates processing steps in the fabrication of semiconductor devices illustrated in FIGS. 6A, 6B and 6C. In the figures, reference numeral "54" and "55" denote cross-sections taken along the lines F-F' and G-G' of FIG. 6A, respectively.

Referring now to FIG. 15, the interlayer insulating layer 135 is patterned so as to form an opening 140' exposing at least a portion of the recess region 125 of the doped region 130. The opening 140' has a groove-shape that crosses over the doped region 125. There are exposed the inner and bottom surfaces of the recess region 125 under the opening 140'. Both outer surfaces of the doped region 130 under the opening 140' are also exposed.

A conductive layer is formed such that it fills the opening 140' and the recess region 125 exposed to the opening 140'. The conductive layer is planarized until the interlayer insulating layer 135 is at least partially exposed, thereby forming a line-shaped connector region 145' as illustrated in FIGS. 6A, 6B and 6C. Therefore, it may be possible to provide the semiconductor device illustrated in FIGS. 6A, 6B and 6C.

According methods of forming semiconductor devices according to some embodiments of the present invention, the over-etching process subsequent to the patterning process of the gate electrode may be performed so as to form the recess region 125. Therefore, a photolithographic process for forming the recess region 125 may not be required. As a result, the recess region 125 may be formed smaller than a linewidth that the photolithographic process can define. Furthermore, it may be possible to simplify the semiconductor process.

In some embodiments of the present invention the recess region formed in the doped region may have a different shape. Semiconductor devices according these embodiments of the present invention may be similar to those discussed above. Thus, like reference numerals denote like elements.

Figure 16A:
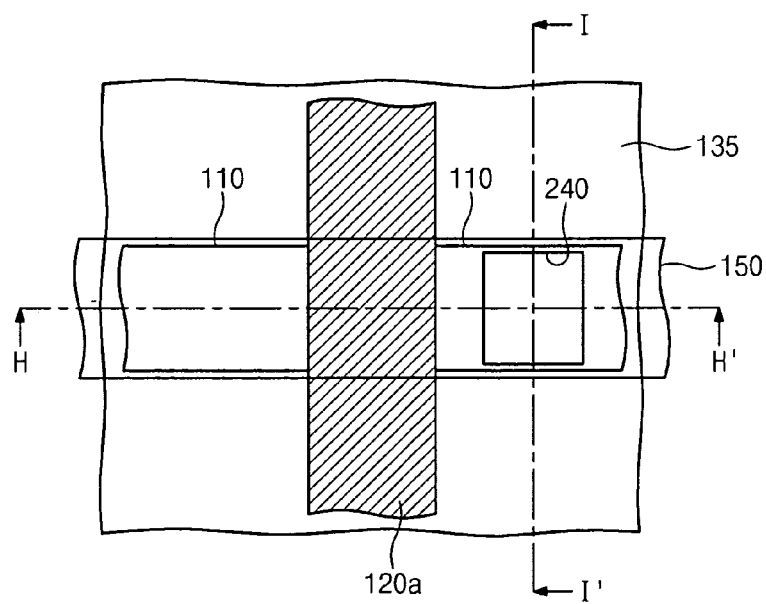
FIG. 16A is a plan view of semiconductor devices according to some embodiments of the present invention.
Figure 16B:
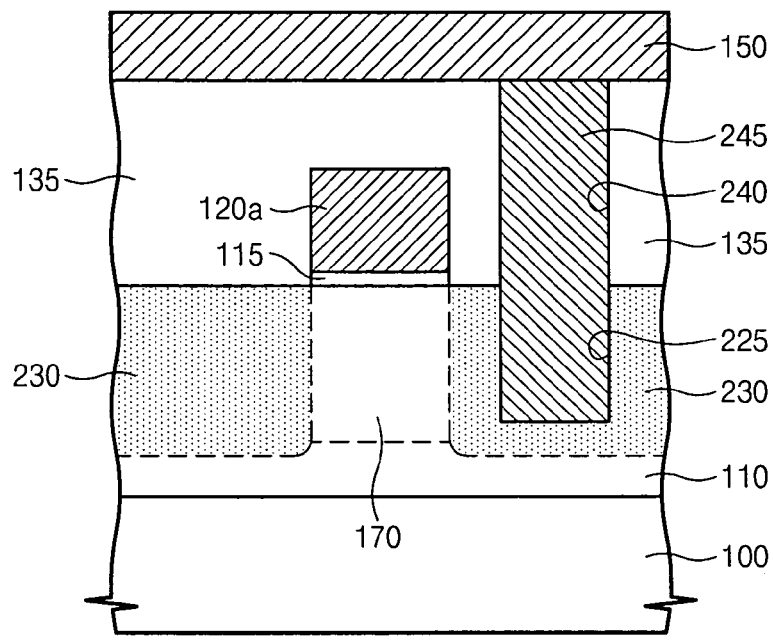
FIGS. 16B and 16C are cross-sections taken along the lines H-H' and I-I' of FIG. 16A, respectively.
Figure 16C:
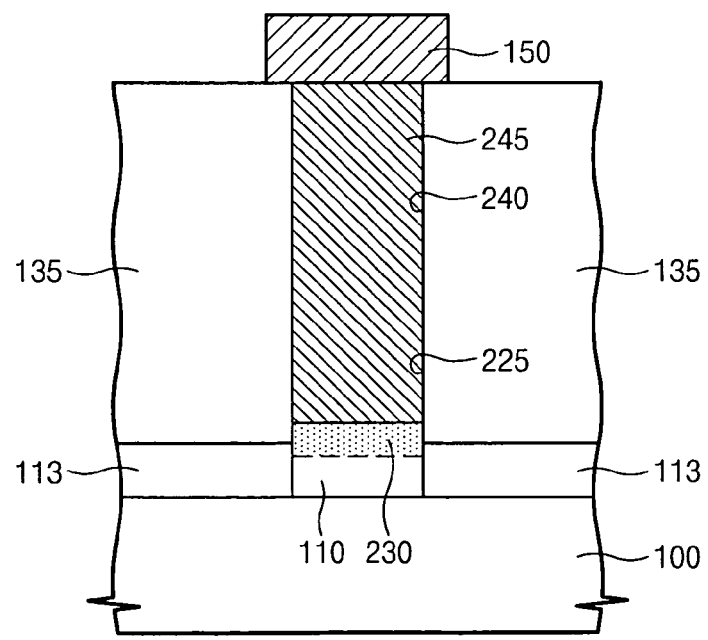

FIG. 16A is a plan view of semiconductor devices according to some embodiments of the present invention, and FIGS. 16B and 16C are cross-sections taken along lines H-H' and I-I' of FIG. 16A, respectively. Referring to FIGS. 16A, 16B and 16C, a gate electrode 120a crosses over a semiconductor fin 110 provided on a substrate 100, and a gate insulating layer 115 is provided between the gate electrode 120a and the semiconductor fin 110. A pair of doped regions 230 are provided in the semiconductor fin 110 at either side of the gate electrode 120a.

A channel region 170 defined at the semiconductor fin 110 under the gate electrode 120a has a pair of first side surfaces connected to the pair of doped regions 230, respectively, and a pair of second side surfaces perpendicular to the pair of first side surfaces. The pair of first side surfaces of the channel region 170 are opposite to each other, and the pair of second side surfaces of the channel region 170 are opposite to each other, too. The pair of second side surfaces of the channel region 170 are covered with the gate electrode 120a.

The interlayer insulating layer 135 is provided on a surface of the substrate 100. An opening 240 penetrates the interlayer insulating layer 135 so as to expose a region of the doped region 230. The doped region 230 exposed to the opening 240 is recessed downward to form a recess region 255. A portion of the inner surface of the recess region 225 is formed by the doped region 230. In other words, the inner surface of the recess region 225, which is close to the channel region 170, is formed by the doped region 230. The other portion of the inner surface of the recess region 225 may be formed by the interlayer insulating layer 135. The inner surfaces of the opening 240 are aligned with the inner surfaces of the recess region 225. In particular, the inner surfaces of the opening 240 are provided in line with the inner surfaces of the recess region 225. The bottom surface of the recess region 225 may be as high as the lower surface of the channel region 170. In some embodiments of the present invention, the bottom surface of the recess region 225 may be lower than the lower surface of the channel region 170.

The recess region 225 includes a portion of the doped region 230 exposed by the opening 240 that is recessed downward. Therefore, between the pair of doped regions 230 provided at either side of the gate electrode 120a, the recess region 225 does not exist in the doped region 230 where the opening 240 does not exist. If the pair of openings 240 to expose the respective pair of the doped regions 230 exist, the recess region 225 may be provided over each of the pair of doped regions 230.

The connector region 245 fills the opening 240 and the recess region 225. Accordingly, the connector region 245 is in contact with the side surfaces of the recess region 225, which is formed by the doped region 230. In some embodiments of the present invention, the connector region 245 includes a conductive material having a lower resistivity than the doped region 230. For example, the connector region 245 may include, for example, conductive metal nitride (e.g., titanium nitride or tantalum nitride), metal (e.g., titanium, tantalum, tungsten, aluminum or copper), and/or metal silicide (e.g., titanium silicide or tantalum silicide).

The opening 240 may be hole-shaped, and thus, the connector region 245 may be pillar-shaped. The interconnection 150 may be provided on the interlayer insulating layer 135, where the interconnection 150 crosses over the gate electrode 120a. The interconnection 150 may be electrically connected to the pillar-shaped connector region 245.

Furthermore, in some embodiments of the present invention having the above described structure, a current path between the connector region 245 and the lower portion of the channel region 170 may be remarkably reduced. Accordingly, the resistance between the lower portion of the channel region 170 and the connector region 245 may be reduced, which may make it possible to increase the amount of driving current flowing through the lower portion of the channel region 170.

The connector region 245, and the doped region 230 having the recess region 225 may be applied to the nonvolatile memory cell illustrated in FIGS. 4A and 4B discussed above. In other words, in the semiconductor device including the connector region 245 and the doped region 230 having the recess region 225, the floating gate 117a and the blocking insulating pattern 118a of FIGS. 4A and 4B may be provided between the gate electrode 120a and the gate insulating layer 115. Furthermore, the semiconductor device including the connector region 245 and the doped region having the recess region 225 may include the channel region 170' having the pair of channel fins 171 illustrated in FIGS. 5A and 5B.

Figure 17A:
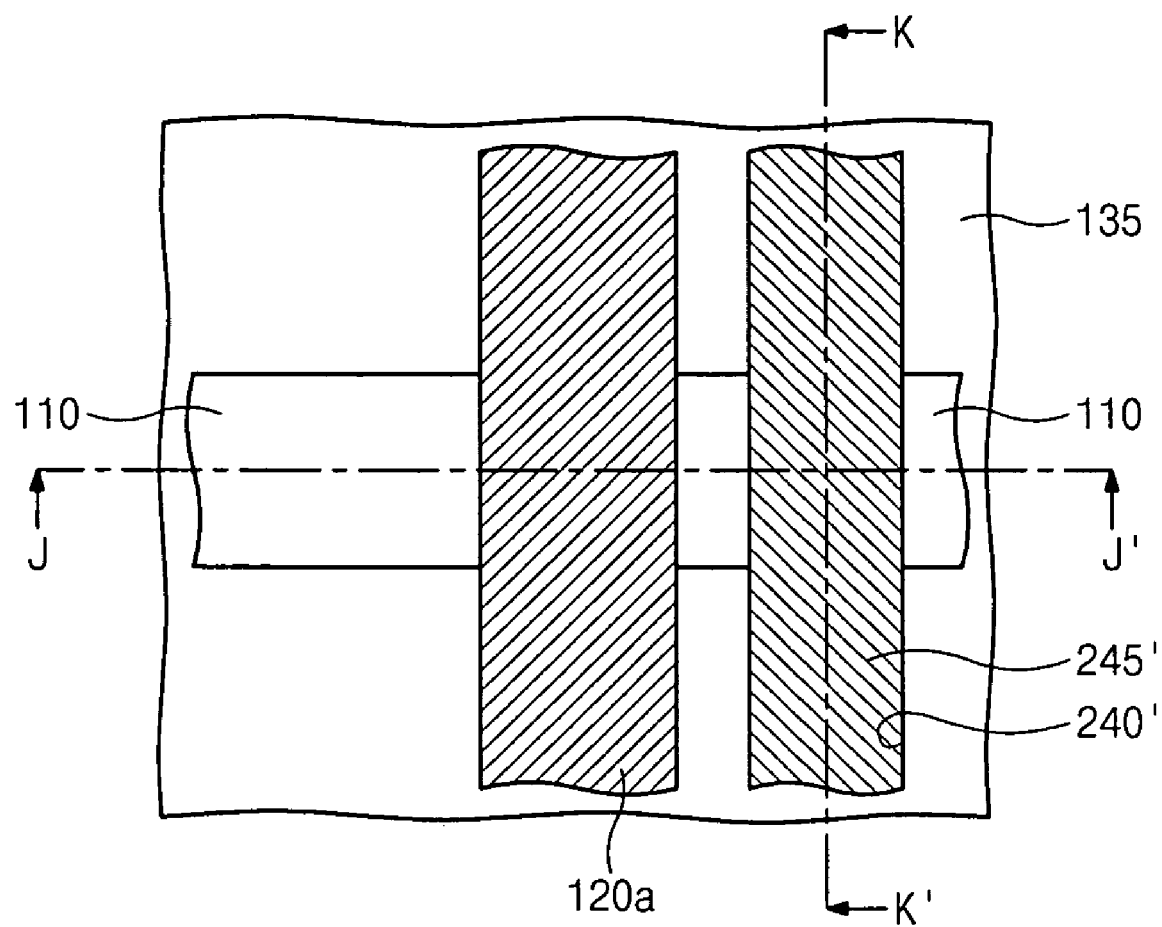
FIG. 17A is a plan view illustrating semiconductor devices according to some embodiments of the present invention.

Meanwhile, the opening 240 and the connector region 245 may have different shapes, which will be illustrated more fully with reference to the accompanying figures. FIG. 17A is a plan view illustrating a connector region included in semiconductor devices according some embodiments of the present invention, and FIGS. 17B and 17C are cross-sections taken along lines J-J' and K-K' of FIG. 17A, respectively.

Figure 17B:
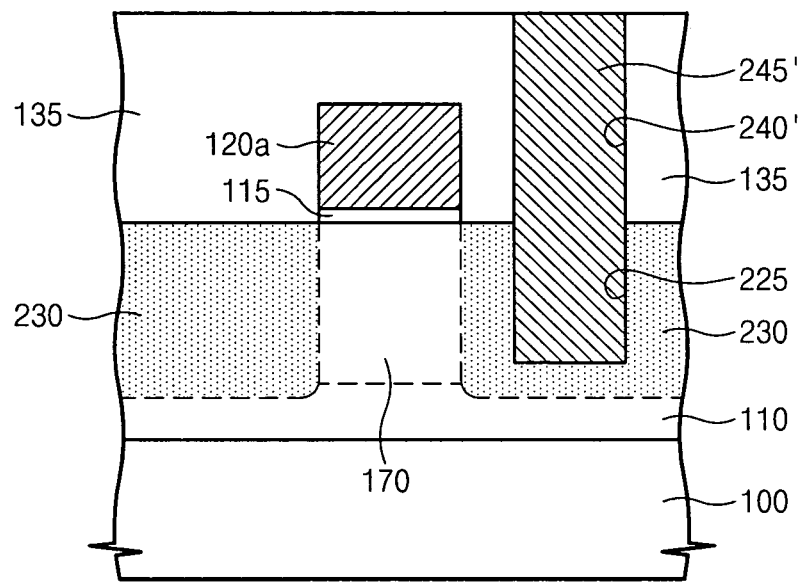
FIGS. 17B and 17C are cross-sections taken along the lines J-J' and K-K' of FIG. 17A, respectively.
Figure 17C:
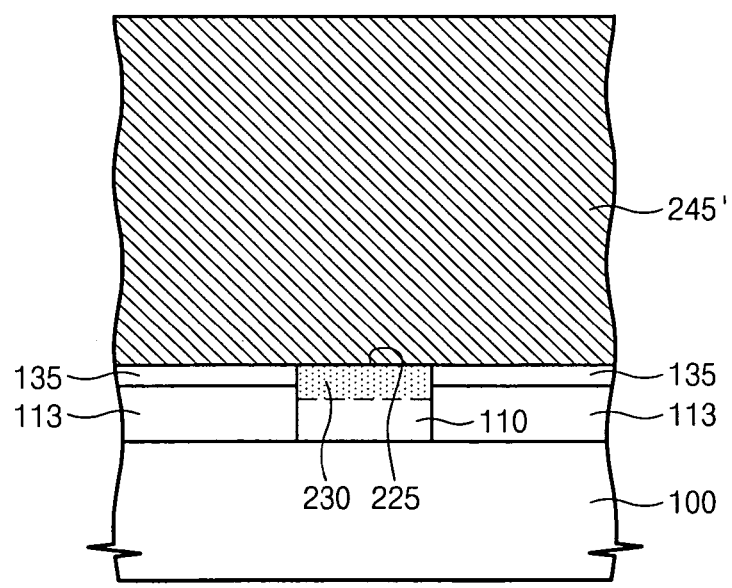

Referring now to FIGS. 17A, 17B and 17C, the interlayer insulating layer 135 is provided on the surface of the substrate 100 having the gate electrode 120a and the doped region 230. A groove-shaped opening 240' is provided in the interlayer insulating layer 135 such that it crosses over the doped region 230. The opening 240' and the gate electrode 120a are parallel to each other, and they are spaced apart from each other. The groove-shaped opening 240' exposes a portion of the doped region 230. The upper surface of the doped region 230 exposed by the opening 240' is recessed downward to thereby form a recess region 225. The recess region 225 is formed by the doped region 230, and it has a pair of inner surfaces which are opposite to each other. The pair of inner surfaces of the recess region 230 are parallel to a boundary surface between the channel region 170 and the doped region 230. The bottom surface of the recess region 230 and the bottom surface of the opening 240' are approximately equal in height to each other. The bottom surface of the recess region 230 is as high as the bottom surface of the opening 240'. In particular, the bottom surface of the recess region 230 may be lower than the bottom surface of the channel region 170.

The connector region 245' fills the groove-shaped opening 240' and the recess region 225. In other words, the connector region 245' contacts the bottom surface of the recess region 225 and the pair of inner surfaces. Herein, the connector region 245' is line-shaped due to the opening 240'. In some embodiments of the present invention, the connector region 245' includes a conductive material having a lower resistivity than the doped region 230. For example, the connector region 245' may include conductive metal nitride (e.g., titanium nitride or tantalum nitride), metal (e.g., titanium, tantalum, tungsten, aluminum or copper), and/or metal silicide (e.g., titanium silicide or tantalum silicide). The line-shaped connector region 245' may be used as a source line.

In some embodiments of the present invention, the connector region 245' is adjacent to the channel region 170, and it is in contact with the inner surfaces of the recess region 225. In particular, the current path between the connector region 245' and the upper portion of the channel region 170 may be similar or even nearly identical to the current path between the connector region 245' and the lower portion of the channel region 170. Accordingly, since the resistance between the connector region 245' and the lower portion of the channel region 170 relatively decreases, it may be possible to increase the amount of driving current flowing through the lower portion of the channel region 170.

Between the gate electrode 120a and the gate insulating layer 115 illustrated in FIGS. 17A, 17B and 17C, the floating gate 117a and the blocking insulating pattern 118a of FIGS. 4A and 4B may also be provided. Furthermore, the channel region 170 of FIGS. 17A, 17B and 17C may be substituted by the channel region 170' having the pair of channel fins 171 of FIGS. 5A and 5B. The connector region 245' and the doped region 230 having the recess region 225 may be applied to the semiconductor device having another three-dimensional channel region.

Figure 18:
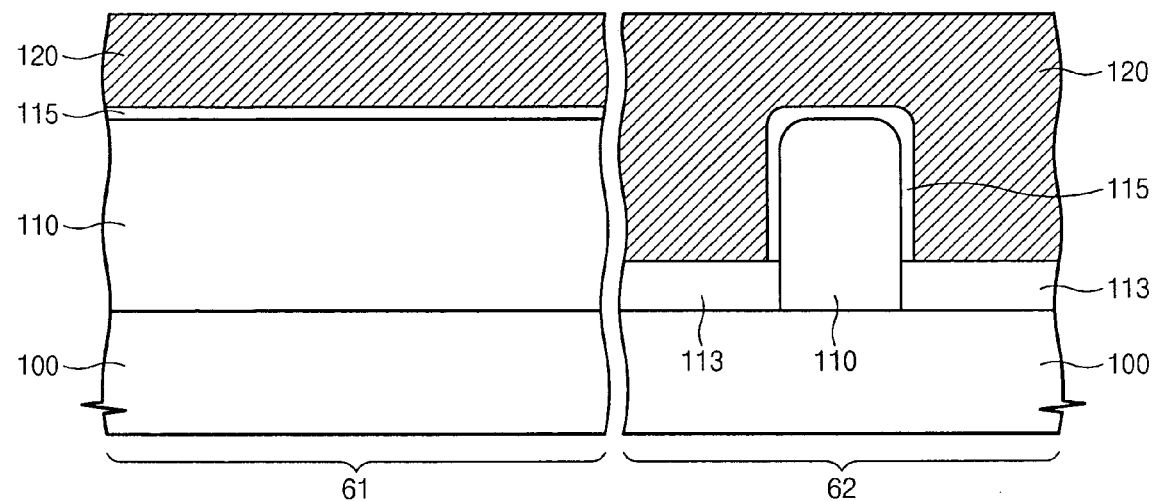
FIGS. 18 through 20 are cross-sections taken along the lines H-H' and I-I' of FIG. 16A, respectively, and illustrated processing steps in the fabrication of semiconductor devices according to some embodiments of the present invention.
Figure 19:
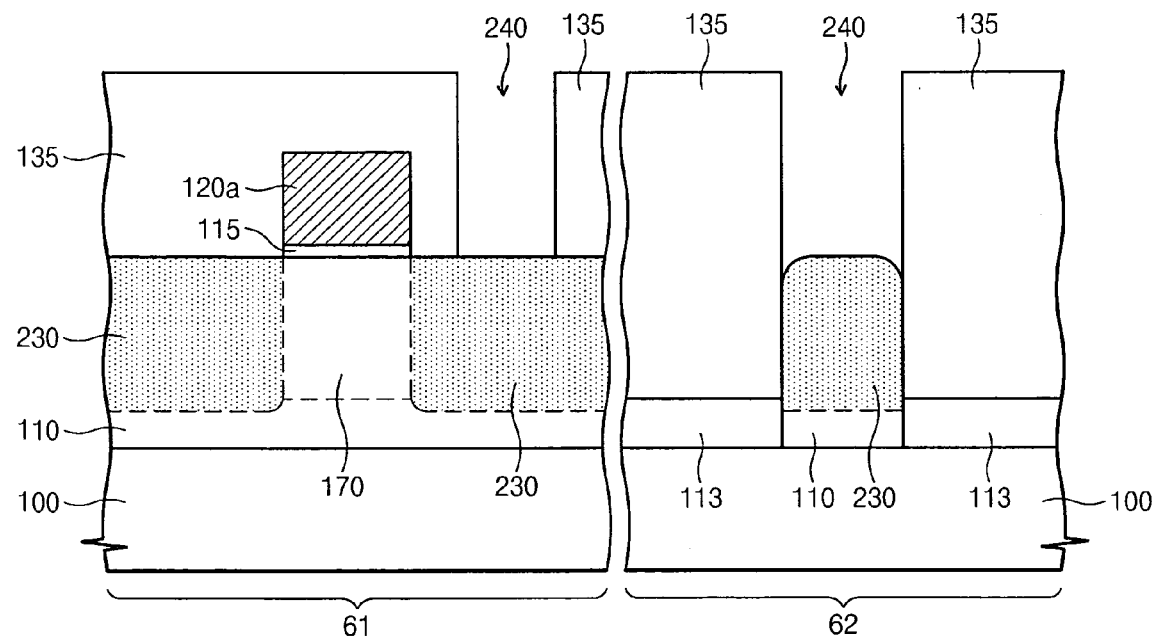
Figure 20:
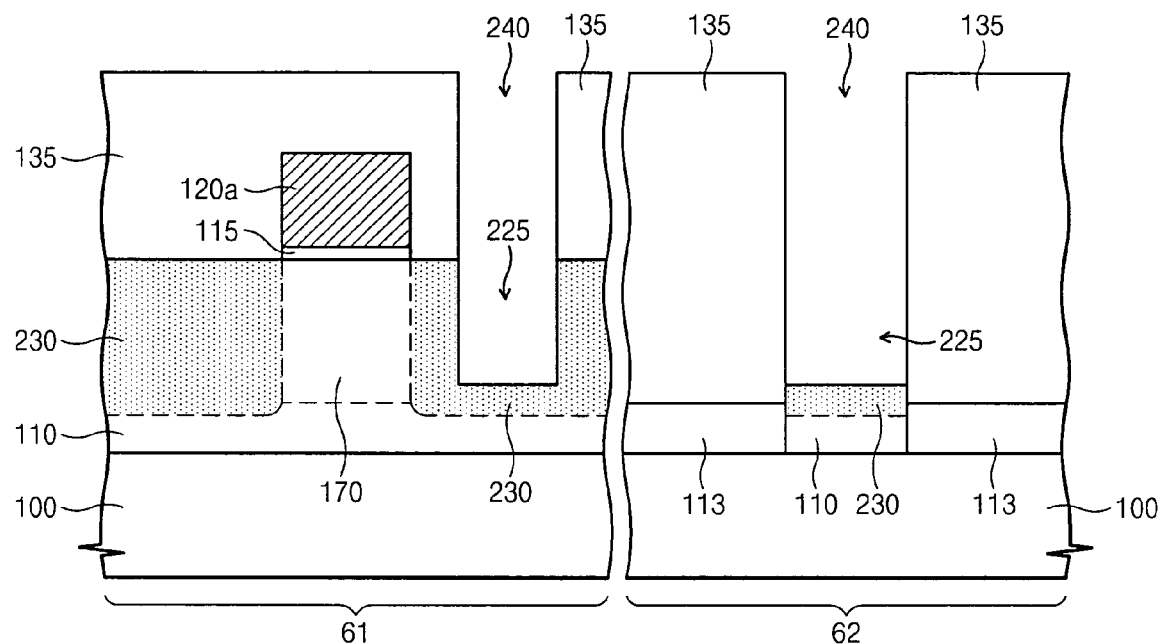

FIGS. 18 through 20 are cross-sections taken along the lines H-H' and I-I' of FIG. 16A, respectively, and illustrate processing steps in the fabrication of semiconductor devices according to some embodiments of the present invention. In the figures, reference numeral "61" and "62" denote cross-sections taken along the lines H-H' and I-I' of FIG. 16A, respectively.

Referring now to FIG. 18, a semiconductor fin 110 is formed on a substrate 100, and a device isolation pattern 113 is formed on the substrate 100 such that it includes a lower portion of the semiconductor fin 110. A gate insulating layer 115 is formed on the exposed surface of the semiconductor fin 110, and a gate conductive layer 120 is formed on the gate insulating layer 115.

The processes from the forming of the semiconductor fin 110 to the forming of the gate conductive layer 120 may be the same as the method of forming the semiconductor device of FIGS. 3A, 3B and 3C. Before forming the gate insulating layer 115, the process of forming the channel recess region 165 in the semiconductor fin 110 may be additionally performed, as illustrated in FIGS. 11 through 14.

Meanwhile, before forming the gate conductive layer 120, the preliminary floating gate 117 and the blocking insulating layer 118 may be additionally formed as illustrated in FIG. 8. In these embodiments, the channel recess region 165 may not be formed because it may be possible to reduce a coupling ratio of the nonvolatile memory cell by increasing a capacitance between the floating gate and the channel region.

Referring now to FIG. 19, the gate conductive layer 120 is patterned to form a gate electrode 120a crossing over the semiconductor fin 110. In case of forming the preliminary floating gate and the blocking insulating layer, the gate conductive layer 120, the blocking insulating layer and the preliminary floating gate are sequentially patterned to form the floating gate, the blocking insulating pattern and the gate electrode 120a which are stacked in sequence. In embodiments of the present invention illustrated in FIGS. 18 through 20, it is not required the over-etching process discussed above.

Ions are implanted into the semiconductor fin 110 at either side of the gate electrode 120a to thereby form a doped region 230. Since the semiconductor fin 110 has a three-dimensional structure, in some embodiments of the present invention, the ions are implanted by isotropic ion-implantation, for example, plasma doping process. In some embodiments of the present invention, the ions may be implanted at right angles or at a predetermined tilt angle to form the doped region 230.

An interlayer insulating layer 135 is formed on the surface of the substrate 100. The interlayer insulating layer 135 is patterned to form an opening 240 exposing the doped region 230. The opening 240 exposes a portion of the upper surface of the doped region 230. The opening 240 is formed having a hole shape.

Referring to FIG. 20, the doped region 230 exposed to the opening 240 is recessed to form the recess region 225 in the doped region 230. A conductive layer is formed on the surface of the substrate 100 such that it fills the opening 240 and the recess region 225. Thereafter, the conductive layer is planarized until the interlayer insulating layer 135 is exposed, thereby forming the connector region 245 of FIGS. 16B and 16C. Afterwards, the interconnection of FIGS. 16A, 16B and 16C is formed on the interlayer insulating layer 135. Thus, it may be possible to provide the semiconductor device as discussed above with respect to FIGS. 16A, 16B and 16C.

Figure 21:
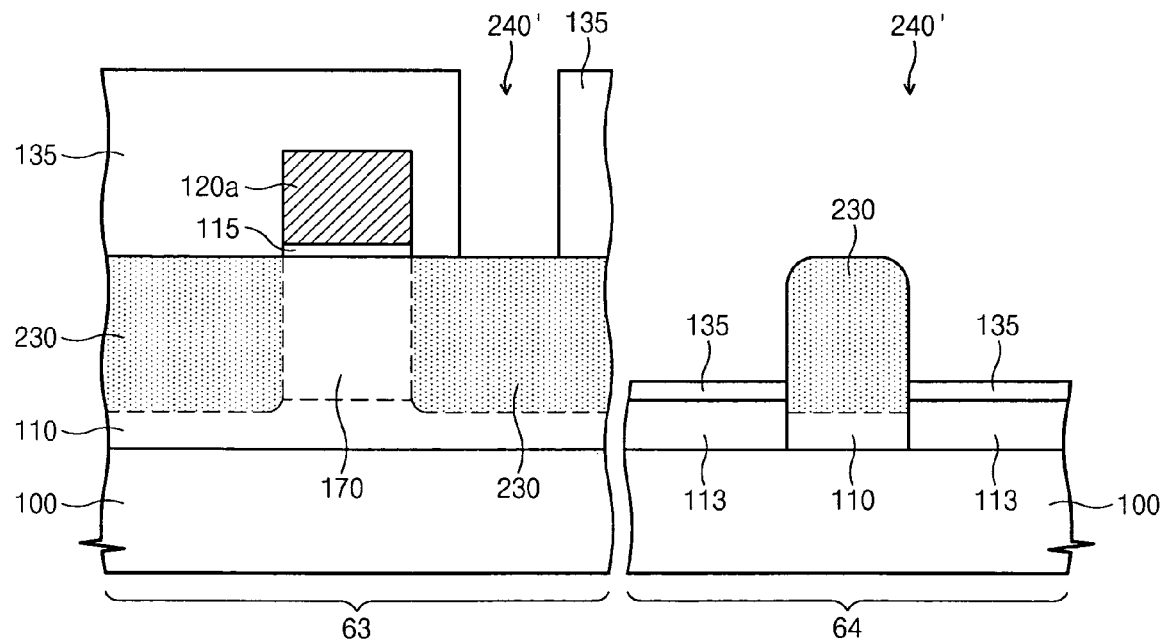
FIGS. 21 and 22 are cross-sections taken along the lines J-J' and K-K' of FIG. 17A, respectively, and illustrate processing steps in the fabrication of semiconductor devices of FIGS. 17A, 17B and 17C.
Figure 22:
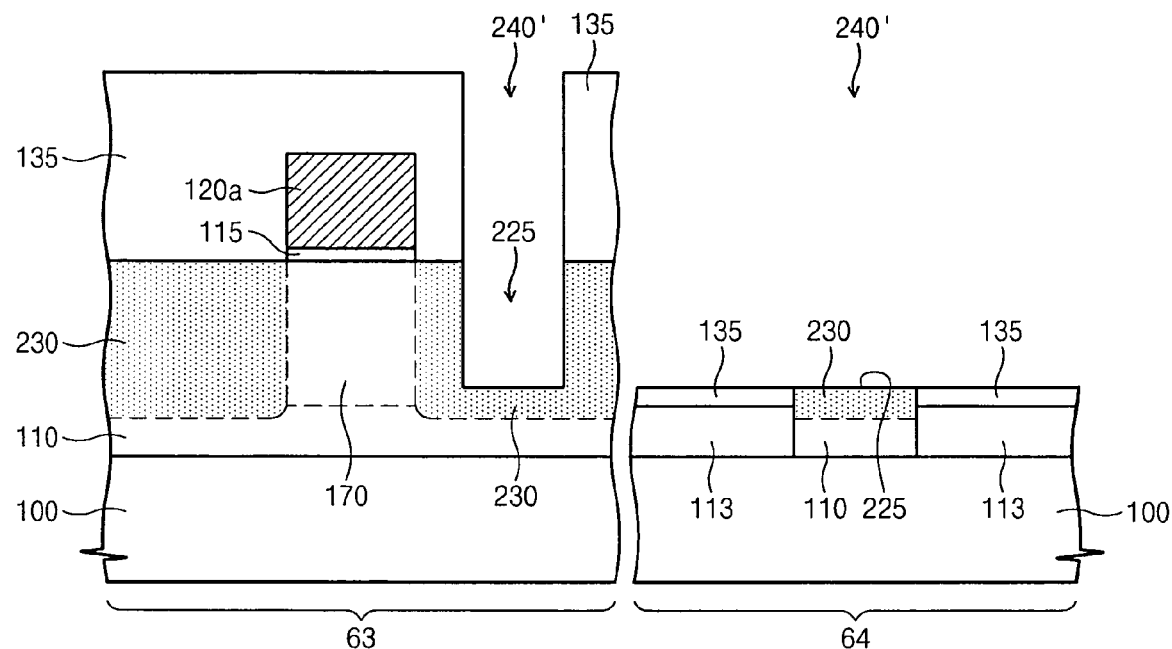

Methods of forming semiconductor devices illustrated in FIGS. 17A, 17B and 17C will be discussed with respect to the accompanying figures. FIGS. 21 and 22 are cross-sections taken along the lines J-J' and K-K' of FIG. 17A, respectively, and illustrated processing steps in the fabrication of semiconductor devices illustrated in FIGS. 17A, 17B and 17C according to some embodiments of the present invention. In the figures, reference numeral "63" and "64" denote cross-sections taken along the lines J-J' and K-K' of FIG. 17A, respectively.

Referring now to FIG. 21, the doped region 230 is formed on the semiconductor fin 110 at either side of the gate electrode 120a, and the interlayer insulating layer 135 is formed on the surface of the substrate 100. The processes from the forming of the semiconductor fin 110 to the forming of the interlayer insulating layer 135 may be performed similarly as the aforementioned methods of FIGS. 18 and 19 (including the method of forming the nonvolatile memory cell having the floating gate, and the method of forming the channel region having the pair of channel fins).

The interlayer insulating layer 135 is patterned to form a groove-shaped opening 240'. The opening 240' crosses over the doped region 230. The gate electrode 120a and the opening 240' are parallel to each other. The opening 240' exposes upper and side surfaces of the doped region 230 under the opening 240'.

Referring now to FIG. 22, the doped region 230 exposed to the opening 240' is recessed so as to form the recess region 225 in the doped region 230. Subsequently, a conductive layer is formed on the entire surface of the substrate 100 such that it fills the opening 240' and the recess region 225. The conductive layer is contacts the inner and bottom surfaces of the recess region 225. The conductive layer is planarized until the interlayer insulating layer 135 is exposed, to thereby form the connector region 245' of FIGS. 17A, 17B and 17C. Thus, it may be possible to provide the semiconductor device of FIGS. 17A, 17B and 17C.

In some embodiments of the present invention, a connector region is in contact with a portion of a doped region close to a lower portion of a channel region. The doped region according to these embodiments of the present invention may not require the recess region discussed above. Like reference numerals denote like elements throughout the specification.

Figure 23A:
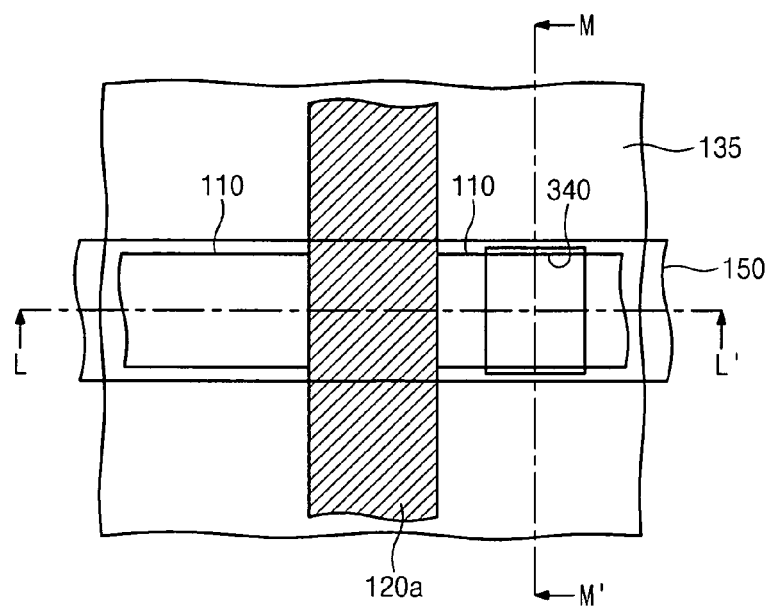
FIG. 23A is a plan view of semiconductor devices according to some embodiments of the present invention.
Figure 23B:
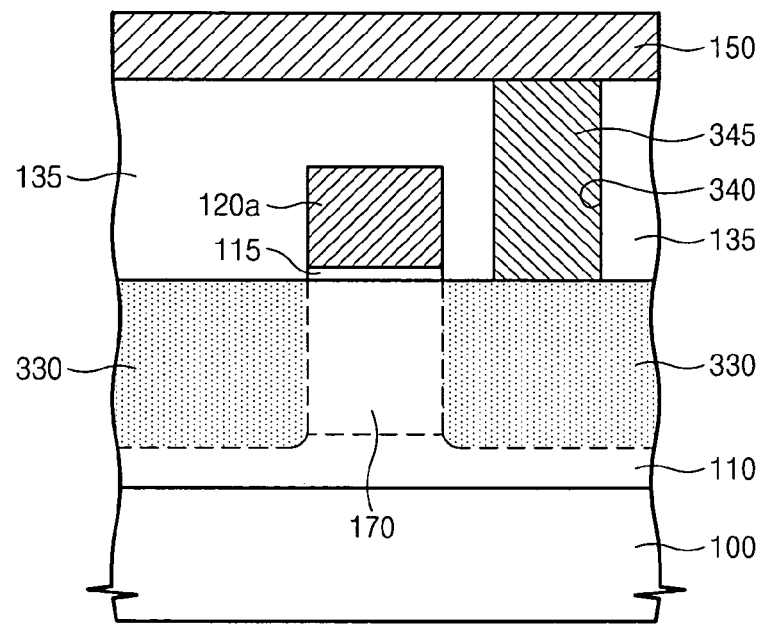
FIGS. 23B and 23C are cross-sections taken along lines L-L' and M-M' of FIG. 23A, respectively.
Figure 23C:
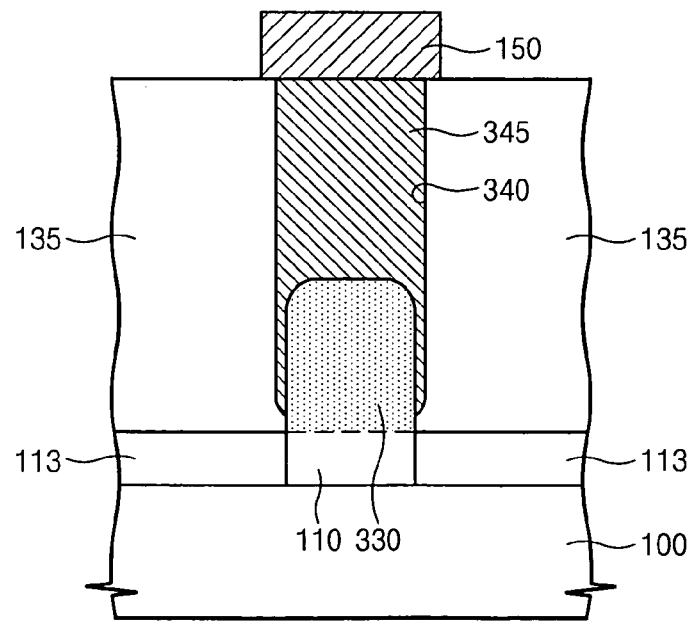

FIG. 23A is a plan view of semiconductor devices according to some embodiments of the present invention, and FIGS. 23B and 23C are cross-sections taken along lines L-L' and M-M' of FIG. 23A, respectively. Referring now to FIGS. 23A, 23B and 23C, a semiconductor fin 110 is provided on a substrate 100, and a device isolation pattern 113 is provided such that it includes a lower portion of the semiconductor fin 110. The gate electrode 120a crosses over the semiconductor fin 110, and a gate insulating layer 115 is interposed between the gate electrode 120a and the semiconductor fin 110. A doped region 330 is provided in the semiconductor fin 110 at either side of the gate electrode 120a. A channel region 170 is defined at the semiconductor fin 110 under the gate electrode 120a. The channel region 170 may be the channel region 170' having the pair of channel fins 171 as illustrated in FIGS. 5A and 5B. The floating gate 117a and the blocking insulating layer 118a of FIGS. 4A and 4B may be interposed between the gate insulating layer 115 and the gate electrode 120a.

An interlayer insulating layer 135 is provided on the surface of the substrate 100, and an opening 340 penetrates the interlayer insulating layer 135 to expose the doped region 330. The opening 340 is hole-shaped. Herein, the width of the opening 340 is greater than the width of the doped region 330 in a direction which is parallel to the gate electrode 120a. The lowermost surface of the opening 340 is as high as the lower surface of the channel region 170. Therefore, the opening 340 exposes the upper surface and both side surfaces of the doped region 330 under the opening 340. In other words, the opening 340 exposes the upper and side surfaces of the doped region 330 having a fin-shaped three-dimensional structure.

The connector region 345 fills the opening 340, and thus, the connector region 345 is in contact with the upper surface and both the side surfaces of the doped region 330 exposed by the opening 340. Accordingly, the current path between the connector region 345 and the lower portion of the channel region 170 may be reduced. Accordingly, the resistance between the connector region 345 and the lower portion of the channel region 170 may be decreased so that the amount of driving current flowing through the lower portion of the channel region 170 may be increased according to some embodiments of the present invention.

In some embodiments of the present invention, the connector region 345 includes a conductive material having a lower resistivity than the doped region 330. For example, in some embodiments of the present invention, the connector region 345 includes a conductive metal nitride (e.g., titanium nitride or tantalum nitride), metal (e.g., titanium, tantalum, tungsten, aluminum or copper), and/or metal silicide (e.g., titanium silicide or tantalum silicide). An interconnection 150 may be provided on the interlayer insulating layer 135 such that it may be in contact with the connector region 345.

The opening 340 has a hole shape, and the connector region 345 has a pillar-shape. In some embodiments of the present invention, the connector region and the opening may have different shapes without departing from the scope of the present invention.

Figure 24A:
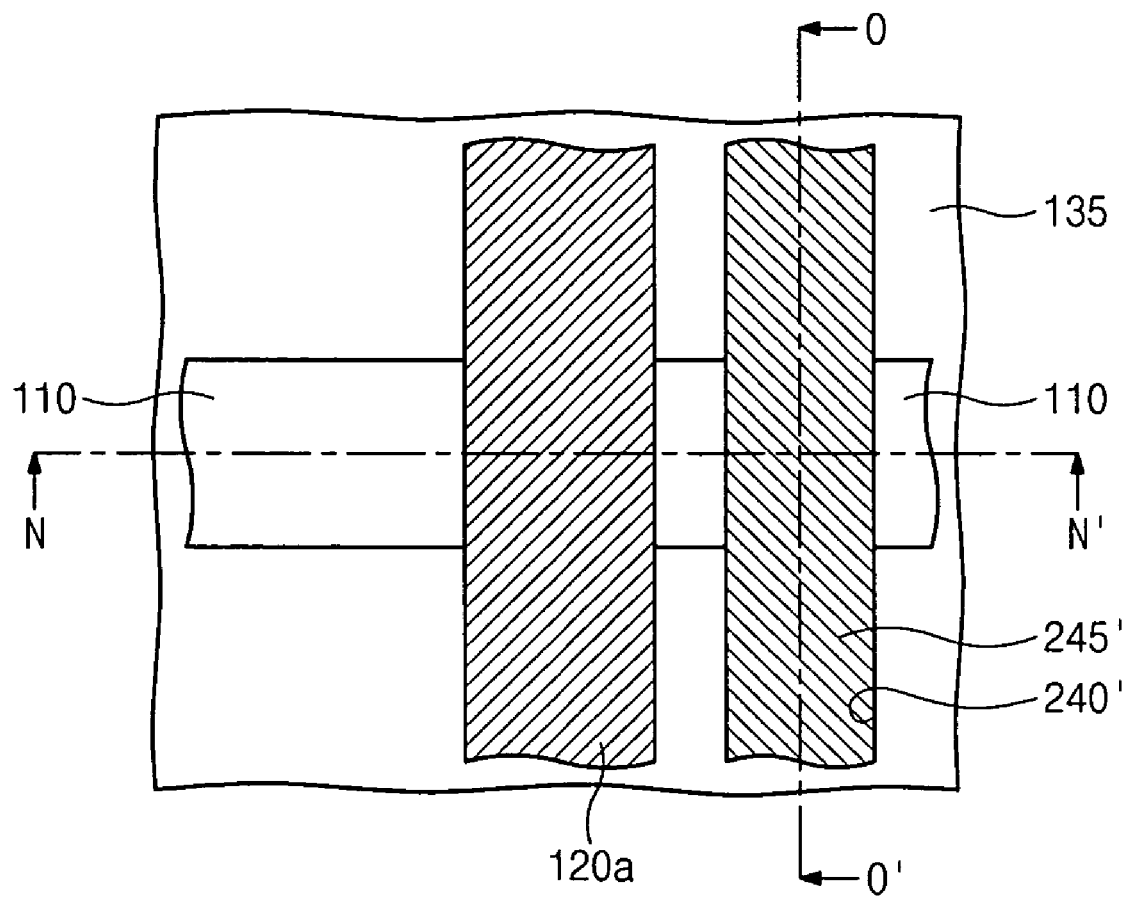
FIG. 24A is a plan view illustrating semiconductor devices according to some embodiments of the present invention.
Figure 24B:
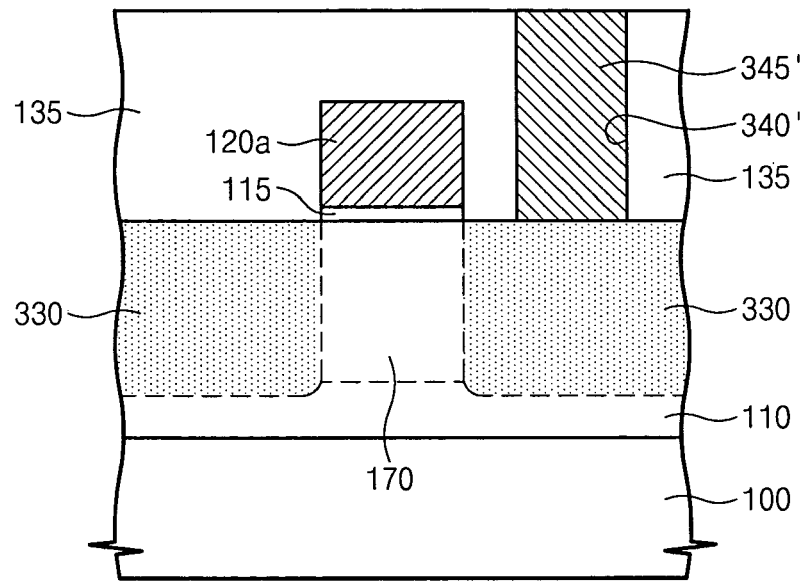
FIGS. 24B and 24C are cross-sections taken along the lines N-N' and O-O' of FIG. 24A, respectively.
Figure 24C:
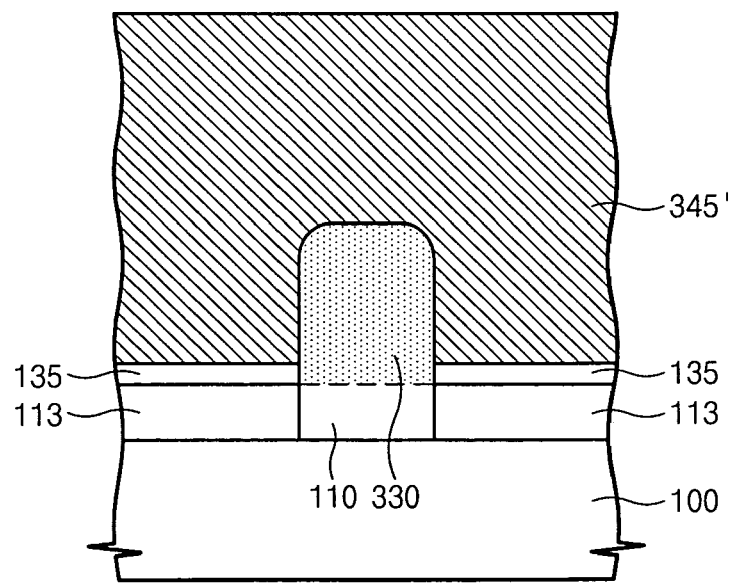

FIG. 24A is a plan view illustrating a connector region included in the semiconductor device according to some embodiments of the present invention, and FIGS. 24B and 24C are cross-sections taken along lines N-N' and O-O' of FIG. 24A, respectively. Referring now to FIGS. 24A, 24B and 24C, the interlayer insulating layer 135 is provided on the surface of the substrate 100 including the gate electrode 120a and the doped region 330. An opening 340' penetrates the interlayer insulating layer 135 to expose the doped region 330. The opening 340' is a grove-shaped one that crosses over the doped region 330, wherein the opening 340' is parallel to the gate electrode 120a. The gate electrode 120a and the opening 340' are spaced apart from each other. The lowermost surface of the opening 340' has a height approximate to the lower surface of the channel region 170. The opening 340' exposes the upper surface and both the side surfaces of the doped region 330 thereunder.

The connector region 345' fills the opening 340'. The connector region 345' is in contact with the upper surface and both the side surfaces of the doped region 330 exposed by the opening 340'. The connector region 345' is line-shaped due to the grove-shaped opening 340'. Since the connector region 345' is also in contact with both the side surfaces of the doped region 330, the current path between the connector region 345' and the lower portion of the channel region 170 may be reduced so that it may be possible to increase the amount of driving current flowing through the lower portion of the channel region 170.

The connector region 345' may be used as a source line. In particular, the connector region 345' may be used as a common source line of a NAND type nonvolatile memory cell. In these embodiments, the gate electrode 120a and the doped region 330 may constitute a ground select transistor. In some embodiments of the present invention, the connector region 345' may be used as a source line of a NOR type nonvolatile memory cell. In these embodiments, the floating gate 117a and the blocking insulating pattern 118a of FIGS. 4A and 4B may be interposed between the gate electrode 120a and the gate insulating layer 115.

Meanwhile, the channel transistor 170 of the fin transistor having the connector region 345' may be substituted by the channel region 170' having the pair of channel fins 171 of FIGS. 5A and 5B. Of course, the channel region 170 of the fin transistor having the connector region 345' may have various different shapes of three-dimensional structures.

Figure 25:
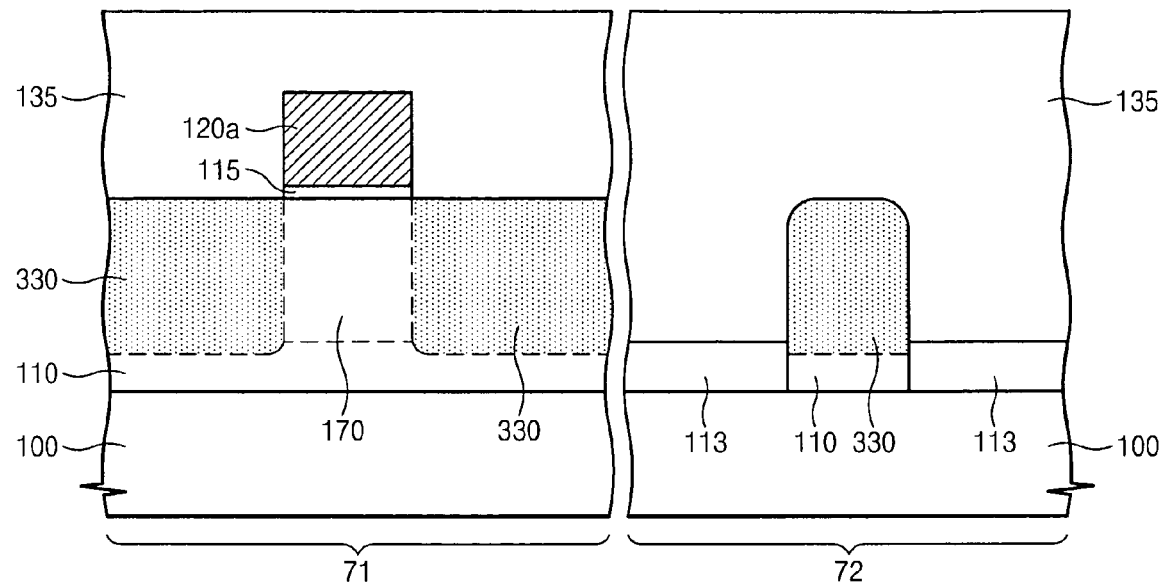
FIGS. 25 and 26 are cross sections taken along the lines I-I' and M-M' of FIG. 23A and illustrate processing steps in the fabrication of semiconductor devices according to some embodiments of the present invention.
Figure 26:
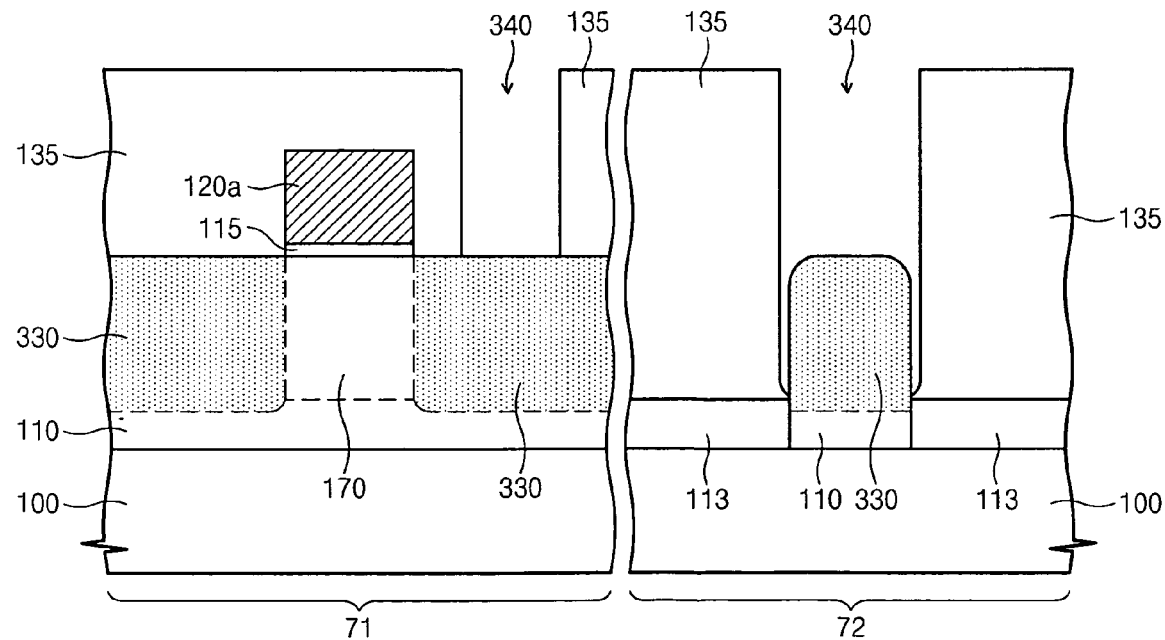

FIGS. 25 and 26 are cross-sections taken along the lines L-L' and M-M' of FIG. 23A, respectively, and illustrated processing steps in the fabrication of semiconductor devices according to some embodiments of the present invention. In the figures, reference numeral "71" and "72" denote cross-sections taken along the lines L-L' and M-M' of FIG. 23A, respectively.

Referring to FIG. 25, a semiconductor fin 110 is formed on a substrate 100, and a device isolation pattern 113 is formed such that it includes the lower portion of the semiconductor fin 110. A gate insulating layer 115 is formed on the exposed surface of the semiconductor fin 110, and a gate conductive layer is formed on the gate insulating layer 115.

The processes from the forming of the semiconductor fin 110 to the firming of the gate conductive layer may be the same as the method as illustrated in FIGS. 3A, 3B and 3C. Before forming the gate insulating layer 115, the forming of the channel recess region 165 in the semiconductor fin 110 may be additionally performed as described in FIGS. 11 through 14.

In the meantime, the preliminary floating gate 117 and the blocking insulating layer 118 may be additionally formed as illustrated in FIG. 8. In these embodiments of the present invention, the channel recess region 165 may not be formed before forming the gate conductive layer because it may be possible to reduce the coupling ratio of the nonvolatile memory cell by increasing the capacitance between the floating gate and the channel region.

Subsequently, referring to FIG. 25, the gate conductive layer is patterned to form the gate electrode 120a crossing over the semiconductor fin 110. Thereafter, a doped region 330 is formed in the semiconductor fin 110 at either side of the gate electrode 120a. In some embodiments of the present invention, the ions are implanted into the semiconductor fin 110 provided at either side of the gate electrode 120a by isotropic ion-implantation, e.g., plasma doping process. In some embodiments of the present invention, the ions may be implanted at right angles or at a predetermined tilt angle to form the doped region 330. An interlayer insulating layer 135 is formed on the surface of the substrate 100.

Referring to FIG. 26, an opening 340 is formed such that it penetrates the interlayer insulating layer 135 to expose the upper surface and both the side surfaces of the doped region 330. The opening 340 has a hole shape. Methods of forming the opening 340 will be discussed below. First, a patterning process including anisotropic etching is performed over the interlayer insulating layer 135 so as to form a preliminary opening exposing the upper surface of the doped region 330. Subsequently, an isotropic etching is performed over the interlayer insulating layer 135 having the preliminary opening to thereby form the opening 340.

In some embodiments of the present invention, only the patterning process including anisotropic etching is performed over the interlayer insulating layer 135 so as to form the opening 340. In this case, the opening of the mask pattern included in the patterning process is wider than the width of the doped region 330 in a direction which is parallel to the gate electrode 120a.

Thereafter, a conductive layer is formed on the surface of the substrate 100 such that it fills the opening 340, and it is planarized until the interlayer insulating layer 135 is exposed, to thereby form the connector region 345 of FIGS. 23B and 23C. Next, there is formed an interconnection 150 of FIGS. 23A, 23B and 23C on the interlayer insulating layer 135, wherein the interconnection 150 is connected to the connector region 345. Thus, it may be possible to provide the semiconductor device of FIGS. 23A, 23B and 23C.

Meanwhile, a method of forming the semiconductor device illustrated in FIGS. 24A, 24B and 24C will be illustrated, which will be set forth referring back to FIGS. 24A, 24B and 24C. This method is similar to the method illustrated in FIGS. 25 and 26, which may include all the methods as discussed with respect to FIG. 25.

Referring to FIGS. 24A, 24B and 24C, the interlayer insulating layer 135 is patterned to form a groove-shaped opening 340'. As described above, the opening 340' exposes the upper surface and both the side surfaces of the doped region 330. Thereafter, a conductive layer is formed on the entire surface of the substrate 100 such that it fills the opening 340', and it is planarized until the interlayer insulating layer 135 is exposed, thereby forming a line-shaped connector region 345'.

The elements corresponding all embodiments may include the same or similar material without departing from the scope of the present invention.

As described above, according to some embodiments of the present invention, the current path between the connector region of low resistivity and the lower portion of the channel region may be reduced. Accordingly, it may be possible to increase the amount of driving current flowing through the lower portion of the channel region. Accordingly, it may be possible to sufficiently secure the amount of driving current which flows through the lower portion as well as the upper portion of the channel region having the three-dimensional structure. Therefore, it may be possible to provide a highly integrated device with excellent performance.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of forming a semiconductor device, the method comprising:
   forming a semiconductor fin on a semiconductor substrate;
   forming a gate insulating layer on a surface of the semiconductor fin;
   forming a gate conductive layer on the gate insulating layer;
   patterning the gate conductive layer to form a gate electrode crossing over the semiconductor fin;
   forming a doped region in the semiconductor fin at either side of the gate electrode;
   forming an interlayer insulating layer on a surface of the substrate; and
   forming a connector region in an opening to be connected to the doped region, the opening penetrating the interlayer insulating layer, wherein a recess region is formed in the doped region connected to the connector region and wherein the connector region contacts an inner surface of the recess region.

2. The method of claim 1, wherein forming the doped region, the recess region and the opening comprises:
   forming the gate insulating layer on a central portion of an upper surface of the semiconductor fin thinner than the gate insulating layer on edges of the upper surface of the semiconductor fin;
   after the forming of the gate electrode, etching the thin gate insulating layer and the semiconductor fin provided at either side of the gate electrode by over-etching using a mask pattern used in the patterning of the gate electrode, to form the recess region;
   forming the doped region in the semiconductor fin having the recess region provided at either side of the gate electrode; and
   patterning the interlayer insulating layer to form an opening exposing at least a portion of the recess region of the doped region, wherein an etch rate of the semiconductor fin is higher than an etch rate of the gate insulating layer during the over-etching.

3. The method of claim 1, wherein forming of the doped region, the recess region and the opening comprises:
   implanting ions into the semiconductor fin at either side of the gate electrode to form the doped region;
   patterning the interlayer insulating layer to form the opening exposing the doped region; and
   recessing the doped region exposed by the opening so as to form the recess region.

4. The method of claim 1, wherein the opening is hole-shaped and wherein the connector region is pillar-shaped such that the connector region fills the opening.

5. The method of claim 1, wherein the opening has a groove-shape parallel to the gate electrode and the connector region is line-shaped such that the connector region fills the opening.

6. The method of claim 1, wherein forming the gate conductive layer is preceded by:
   forming a preliminary floating gate on the gate insulating layer on both side surfaces and an upper surface of the semiconductor fin; and
   conformally forming a blocking insulating layer on the substrate including the preliminary floating gate, wherein forming of the gate electrode comprises:
   patterning the gate conductive layer, the blocking insulating layer and the preliminary floating gate so as to form a floating gate, a blocking insulating pattern and the gate electrode which are stacked in sequence.

7. The method of claim 1, wherein forming of the gate insulating layer is preceded by:
   recessing a portion of the upper surface of the semiconductor fin to form a pair of channel fins and a channel recess region therebetween, wherein the gate insulating layer is formed on bottom and inner surfaces of the channel recess region and wherein the gate electrode fills the channel recess region and covers the pair of channel fins.

8. A method of forming a semiconductor device, the method comprising:
   forming a gate insulating layer on a semiconductor fin formed on a semiconductor substrate;
   forming a gate conductive layer on the gate insulating layer;
   patterning the gate conductive layer to form a gate electrode crossing over the gate semiconductor fin;
   forming a doped region on the semiconductor fin provided at either side of the gate electrode;
   forming an interlayer insulating layer on a surface of the semiconductor substrate;
   patterning the interlayer insulating layer to expose at least a portion of an upper surface and both side surfaces of the doped region; and
   forming a connector region filling an opening.

9. The method of claim 8, wherein the opening is hole-shaped such that it has a greater width than a width of the doped region parallel to a channel width of the channel region under the gate electrode and wherein the connector region is pillar-shaped such that it fills the opening.

10. The method of claim 8, wherein the opening has a groove-shape such that it crosses over the doped region parallel to the gate electrode and wherein the connector region is line-shaped such that it fills the opening.

11. The method of claim 8, wherein forming of the gate conductive layer is preceded by:
    forming a preliminary floating gate on the gate insulating layer, the preliminary floating gate covering both side surfaces and an upper surface of the semiconductor fin; and
    conformally forming a blocking insulating layer on the substrate including the preliminary floating gate, wherein forming of the gate electrode comprises:
    patterning the gate conductive layer, the blocking insulating layer and the preliminary floating gate so as to form a floating gate, a blocking insulating pattern and the gate electrode which are stacked in sequence.

12. The method of claim 8, wherein forming of the gate insulating layer is preceded by recessing a portion of the upper surface of the semiconductor fin to form a pair of channel fins and a channel recess region therebetween, wherein the gate insulating layer is formed on bottom and inner surfaces of the channel recess region and wherein the gate electrode fills the channel recess region and covers the pair of channel fins.

* * * * *